US009704944B2

(12) United States Patent
Dirnecker et al.

(10) Patent No.: US 9,704,944 B2
(45) Date of Patent: Jul. 11, 2017

(54) THREE PRECISION RESISTORS OF DIFFERENT SHEET RESISTANCE AT SAME LEVEL

(71) Applicant: TEXAS INSTRUMENTS DEUTSCHLAND GMBH, Freising (DE)

(72) Inventors: Christoph Dirnecker, Eching (DE); Karsten Spinger, Ingolstadt (DE); Franz Stingl, Moosburg (DE)

(73) Assignee: TEXAS INSTRUMENTS DEUTSCHLAND GMBH, Freising (DE)

( * ) Notice: Subject to any disclaimer, the term of this patent is extended or adjusted under 35 U.S.C. 154(b) by 0 days.

(21) Appl. No.: 13/781,179

(22) Filed: Feb. 28, 2013

(65) Prior Publication Data
US 2014/0239449 A1    Aug. 28, 2014

(51) Int. Cl.
| H01L 29/00 | (2006.01) |
| H01L 49/02 | (2006.01) |
| H01L 27/08 | (2006.01) |
| H01L 27/01 | (2006.01) |

(52) U.S. Cl.
CPC .......... H01L 28/20 (2013.01); H01L 27/0802 (2013.01); H01L 27/016 (2013.01); H01L 28/24 (2013.01)

(58) Field of Classification Search
CPC ... H01C 7/006; H01L 27/016; H01L 27/0802; H01L 28/20; H01L 28/24
USPC .. 257/536, 537, E21.004, E21.005, E21.006
See application file for complete search history.

(56) References Cited

U.S. PATENT DOCUMENTS

| 3,714,709 | A | * | 2/1973 | Liederbach | H01L 21/705 257/531 |
| 5,414,404 | A | * | 5/1995 | Jeong et al. | 338/307 |
| 6,081,014 | A | * | 6/2000 | Redford et al. | 257/359 |
| 6,297,556 | B1 | * | 10/2001 | Heger et al. | 257/766 |
| 6,855,585 | B1 | * | 2/2005 | Kalnitsky | H01L 27/0802 257/E27.047 |
| 7,208,388 | B2 | * | 4/2007 | Beach | H01C 7/006 257/213 |
| 7,986,027 | B2 | * | 7/2011 | Hynes et al. | 257/536 |
| 2003/0183880 | A1 | * | 10/2003 | Goto | H01L 27/0629 257/379 |
| 2006/0088973 | A1 | | 4/2006 | Chun | |
| 2007/0069334 | A1 | * | 3/2007 | Beach et al. | 257/536 |
| 2012/0170352 | A1 | * | 7/2012 | Le Neel et al. | 365/148 |

FOREIGN PATENT DOCUMENTS

| JP | S5552252 A | 4/1980 |
| JP | 2010027874 A | 2/2010 |

* cited by examiner

*Primary Examiner* — Lynne Gurley
*Assistant Examiner* — Peter M Albrecht
(74) *Attorney, Agent, or Firm* — Jacqueline J. Garner; Charles A. Brill; Frank D. Cimino

(57) ABSTRACT

An integrated circuit contains three thin film resistors over a dielectric layer. The first resistor body includes only a bottom thin film layer and the first resistor heads include the bottom thin film layer, a middle thin film layer and a top thin film layer. The second resistor body and heads include all three thin film layers. The third resistor body does not include the middle thin film layer. The three resistors are formed using two etch masks.

23 Claims, 24 Drawing Sheets

THREE PRECISION RESISTORS OF DIFFERENT SHEET RESISTANCE AT SAME LEVEL

FIELD OF THE INVENTION

This invention relates to the field of integrated circuits. More particularly, this invention relates to thin film resistors in integrated circuits.

BACKGROUND OF THE INVENTION

An integrated circuit may include thin film resistors with a wide range of resistances. For example, the integrated circuit may include a thin film resistor with a resistance less than 10 ohms used in a sensor circuit, another resistor with a resistance of a few thousand ohms used as a feedback resistance in an amplifier circuit, and yet another resistor with a resistance over a million ohms in a voltage divider circuit. Thin film resistors may be provide a desired level of precision compared to other resistors such as diffused well resistors. Forming thin film resistors with a wide range of resistances while maintaining a desired cost and complexity of fabrication of the integrated circuit may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing three thin film resistors with resistor bodies of three different combinations of three thin film layers may be formed using two pattern steps. A bottom thin film layer is formed over a dielectric layer of the integrated circuit. A middle thin film layer is formed on the bottom thin film layer. A first etch mask is formed over the middle thin film layer to cover a first body and first heads of a first resistor, cover a second body and second heads of a second resistor, and expose at least a third body of a third resistor. A first etch process removes the middle thin film layer and the bottom thin film layer in areas exposed by the first etch mask.

A top thin film layer is formed over an existing top surface of the integrated circuit, contacting the middle thin film layer over the first body and the first heads for the first resistor and over the second body and the second heads for the second resistor. A second etch mask is formed over the top thin film layer, covering the first heads for the first resistor, the second body and the second heads for the second resistor and the third body and third heads for the third resistor, and exposing the first body of the first resistor. A second etch process removes the top thin film layer and the middle thin film layer in areas exposed by the second etch mask. Resistive material in the bottom thin film layer and the middle thin film layer and etch reagents of the second etch process are selected to provide etch selectivity for the middle thin film layer with respect to the bottom thin film layer, so that the second etch process leaves a desired portion, in some versions substantially all, of the bottom thin film layer.

The first body of the first resistor includes the bottom thin film layer and is free of the middle thin film layer and the top thin film layer. The first heads for the first resistor include the bottom thin film layer, the middle thin film layer and the top thin film layer. The second body of the second resistor includes the bottom thin film layer, the middle thin film layer and the top thin film layer. The second heads of the second resistor include the bottom thin film layer, the middle thin film layer and the top thin film layer. The third body of the third resistor includes the top thin film layer and is free of the middle thin film layer. The third heads for the third resistor includes the top thin film layer.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
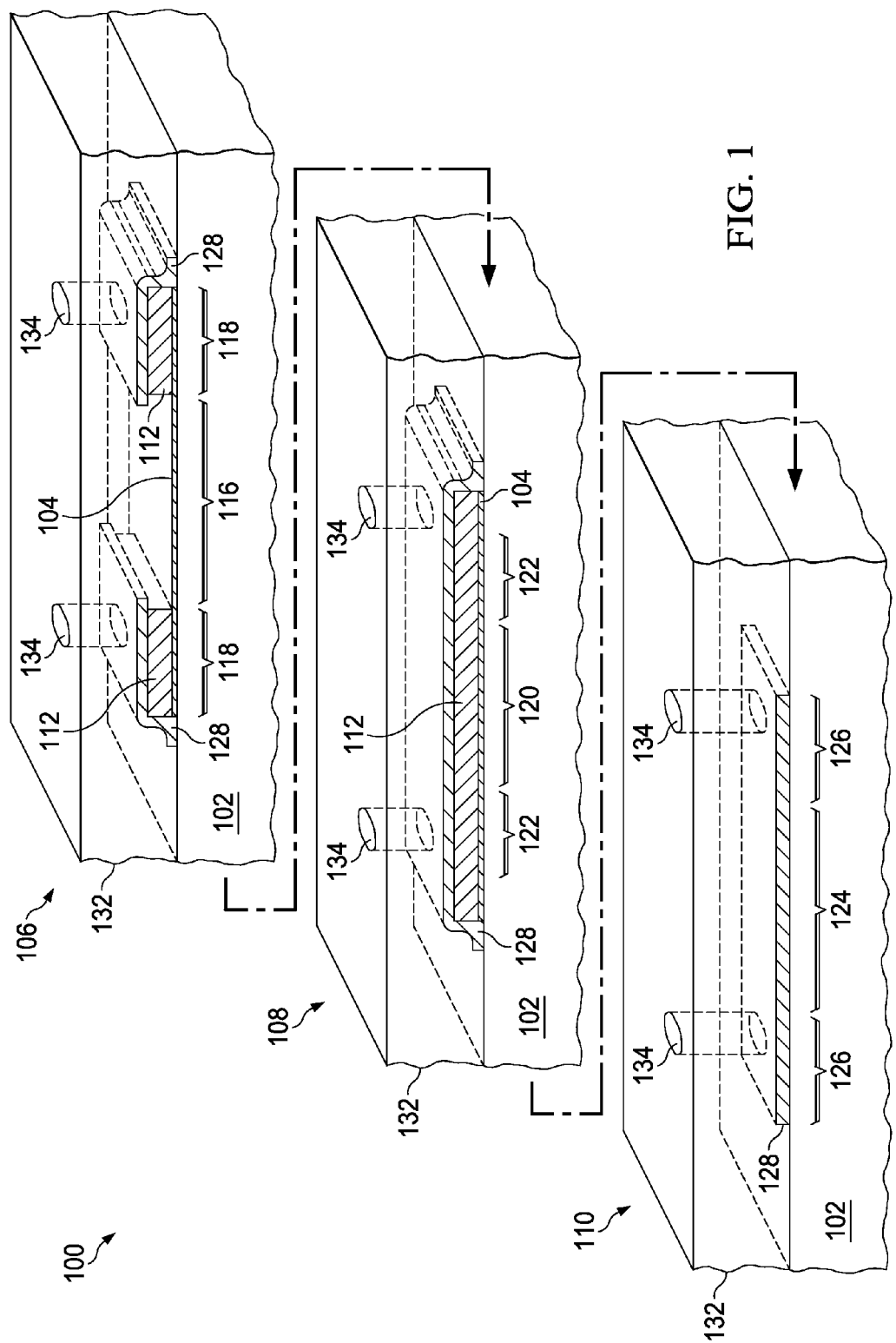
FIG. 1 is a cross section of an exemplary integrated circuit containing three thin film resistors.

FIG. 1 is a cross section of an exemplary integrated circuit containing three thin film resistors. The integrated circuit 100 includes an area for a first resistor 106, a second resistor 108 and a third resistor 110 on a first dielectric layer 102 at an existing top surface of the integrated circuit 100.

The first resistor 106 has a first body 116 which includes a bottom thin film layer 104, and is free of a middle thin film layer 112 and a top thin film layer 128. The first resistor 106 has first heads 118 which include the bottom thin film layer 104, the middle thin film layer 112 and the top thin film layer 128.

The second resistor 108 has a second body 120 which includes the bottom thin film layer 104, the middle thin film layer 112 and the top thin film layer 128. The second resistor 108 has second heads 122 which include the bottom thin film layer 104, the middle thin film layer 112 and the top thin film layer 128.

The third resistor 110 has a third body 124 which includes the top thin film layer 128 and is free of the middle thin film layer 112. The third resistor 110 has third heads 126 which include the top thin film layer 128. In the instant example, the third body 124 is free of the bottom thin film layer 104 and the middle thin film layer 112.

A second dielectric layer 132 is disposed over the first resistor 106, the second resistor 108 and the third resistor 110. The second dielectric layer 132 may be a typical interlevel dielectric layer in an interconnect structure.

Electrically conductive interconnect vias 134 are formed in the second dielectric layer 132 so as to make electrical contact to the first heads 118, the second heads 122 and the third heads 126. The interconnect vias 134 may be formed, for example, by etching via holes in the second dielectric layer 132 so as to expose the top thin film layer 128. Subsequently, a layer stack of interconnect metal is formed in the contact holes and over the second dielectric layer 132. The layer stack of interconnect metal may include a liner of titanium and titanium nitride and a fill metal of tungsten. The layer stack of interconnect metal may include a liner of tantalum nitride and a fill metal of copper. The fill metal may be removed from over the second dielectric layer 132 using chemical mechanical polish (CMP) processes and/or plasma etchback processes. Alternatively, the interconnect vias 134 may be formed of liner and copper in a dual damascene interconnect process with interconnect lines above the interconnect vias 134. In another version of the instant example, electrical connections to the first resistor 106, the second resistor 108 and the third resistor 110 may be made to tops of vias in the first dielectric layer 102 or may be made using interconnect elements between the first dielectric layer 102 and the second dielectric layer 132.

Figure 2A:
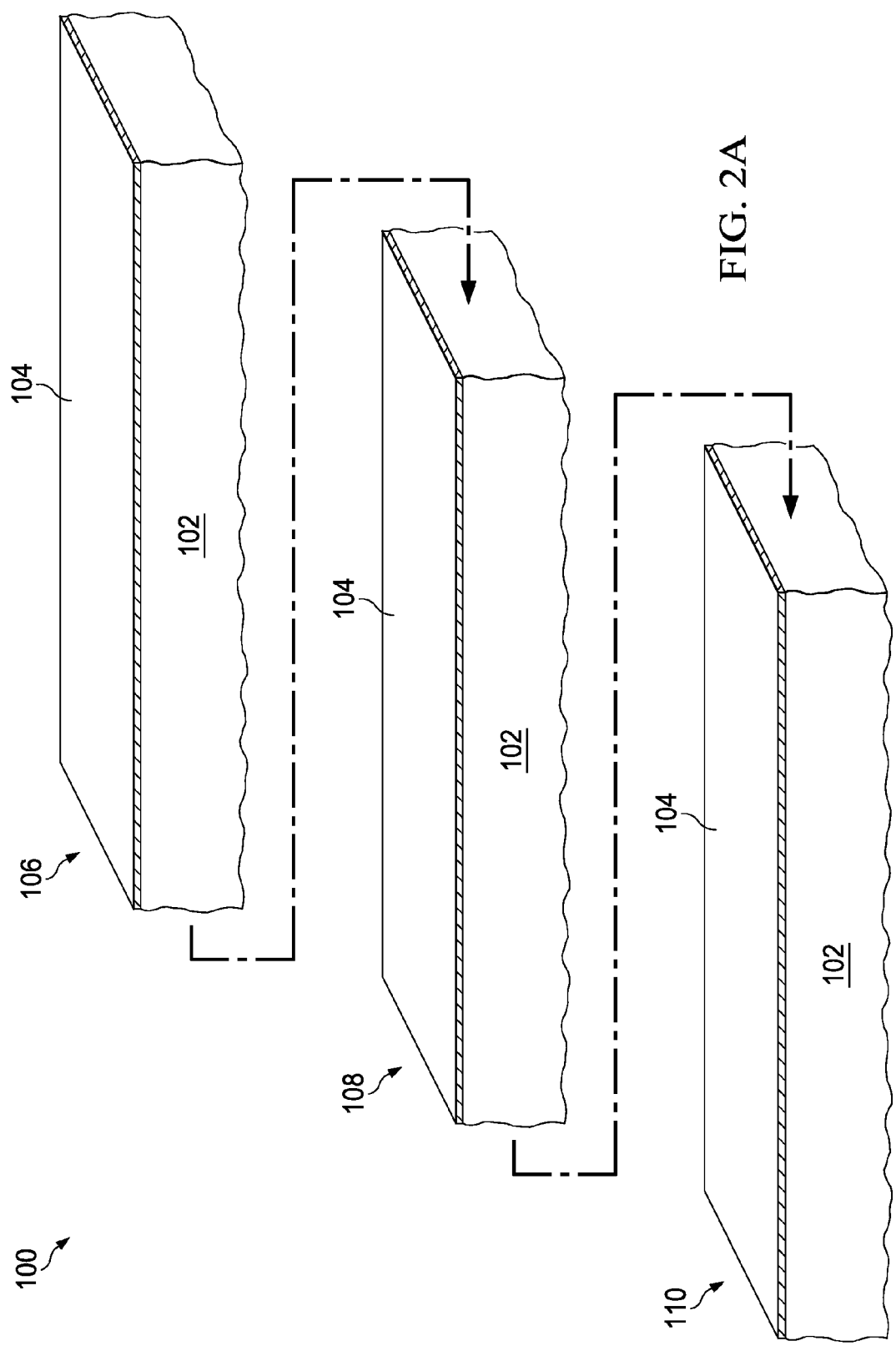
FIG. 2A through FIG. 2H are cross sections of the integrated circuit of FIG. 1, depicted in successive stages of fabrication.

FIG. 2A through FIG. 2H are cross sections of the integrated circuit of FIG. 1, depicted in successive stages of fabrication. Referring to FIG. 2A, the integrated circuit 100 includes the first dielectric layer 102 at an existing top surface of the integrated circuit 100. The first dielectric layer 102 may include, for example, silicon dioxide and may be part of an inter-level dielectric layer separating metal interconnect levels of the integrated circuit 100. The bottom thin film layer 104 is formed over the first dielectric layer 102 in the area for the first resistor 106, the second resistor 108 and the third resistor 110. The bottom thin film layer 104 may be, for example, 2 to 20 nanometers of resistive material, with a sheet resistance, for example, of 200 to 20,000 ohms per square, depending on the composition of the bottom thin film layer 104. In one example, 3.5 nanometers of carbon doped silicon chromium may provide a sheet resistance of 1000 ohms per square. Other materials that may be used for the bottom thin film layer 104 include, for example, silicon chromium, nickel chromium, nickel chromium aluminum, nitrogen doped silicon chromium formed be reactive sputtering, and oxygen doped silicon chromium formed by reactive sputtering. Optionally, one or more adhesion layers and/or cap layers may be formed below and/or above, respectively, the bottom thin film layer 104.

Figure 2B:
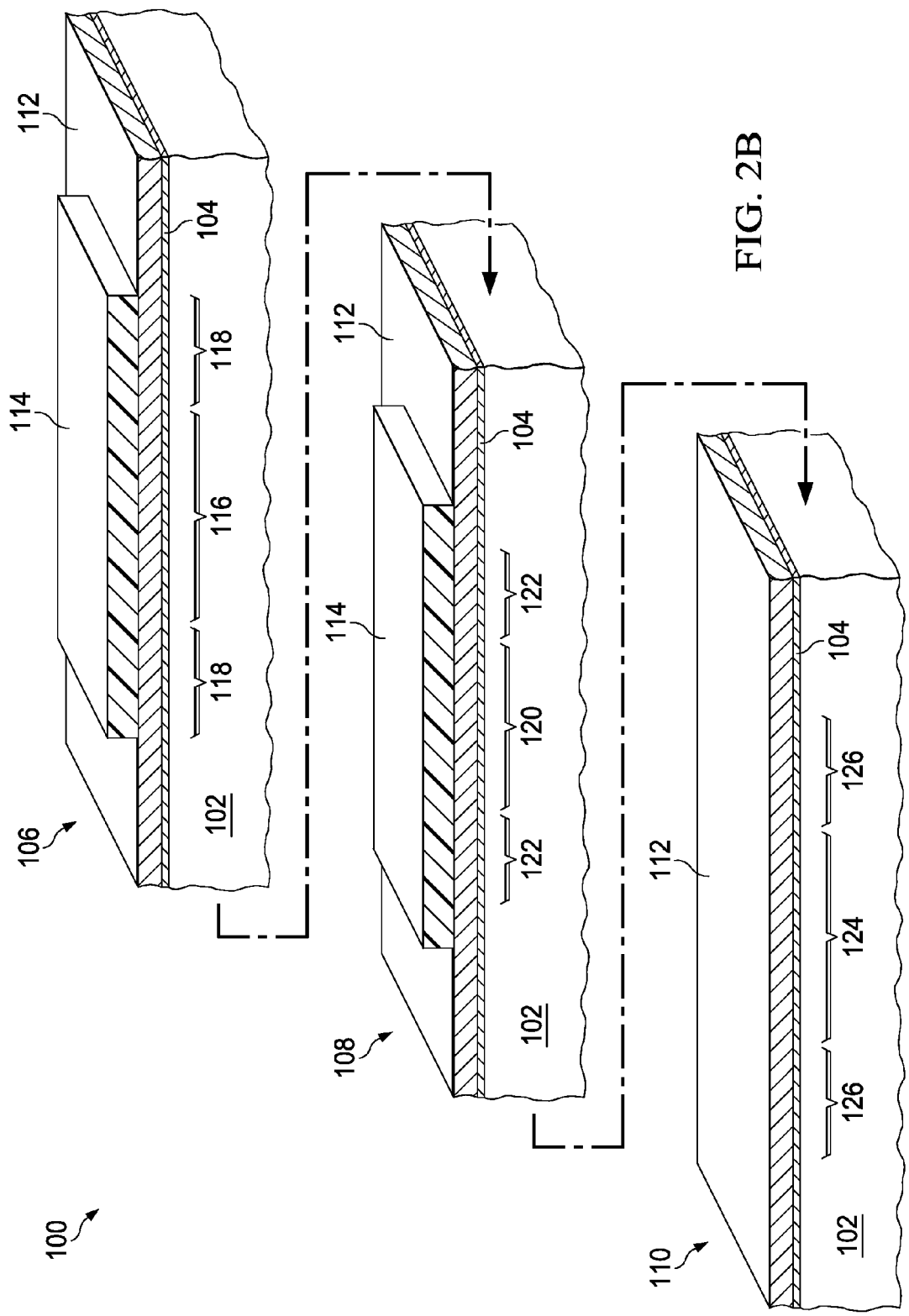

Referring to FIG. 2B, the middle thin film layer 112 is formed over the bottom thin film layer 104 and makes electrical connection to the bottom thin film layer 104. The middle thin film layer 112 may be, for example, 20 to 200 nanometers of resistive material having a sheet resistance of 20 milliohms per square to 20 ohms per square. In one example, the middle thin film layer 112 may be 100 nanometers of titanium nitride formed by a reactive sputter process or titanium tungsten formed by a sputter process, and may have a sheet resistance, for example, of 10 ohms per square. In another example, the middle thin film layer 112 may be aluminum formed by a sputter process and may have a sheet resistance, for example, of 50 to 250 milliohms per square. Other materials that may be used for the middle thin film layer 112 include, for example, titanium and tungsten. Optionally, one or more adhesion layers and/or cap layers may be formed below and/or above, respectively, the middle thin film layer 112.

A first etch mask 114 is formed over the middle thin film layer 112. The first etch mask covers an area for a first body 116 of the first resistor 106 and areas for first heads 118 of the first resistor 106. The first etch mask also covers an area for a second body 120 of the second resistor 108 and areas for second heads 122 of the second resistor 108. In the instant example, the first etch mask 114 exposes an area for a third body 124 of the third resistor 110 and areas for third heads 126 of the third resistor 110. The first etch mask 114 may include photoresist formed by a photolithographic process.

Figure 2C:
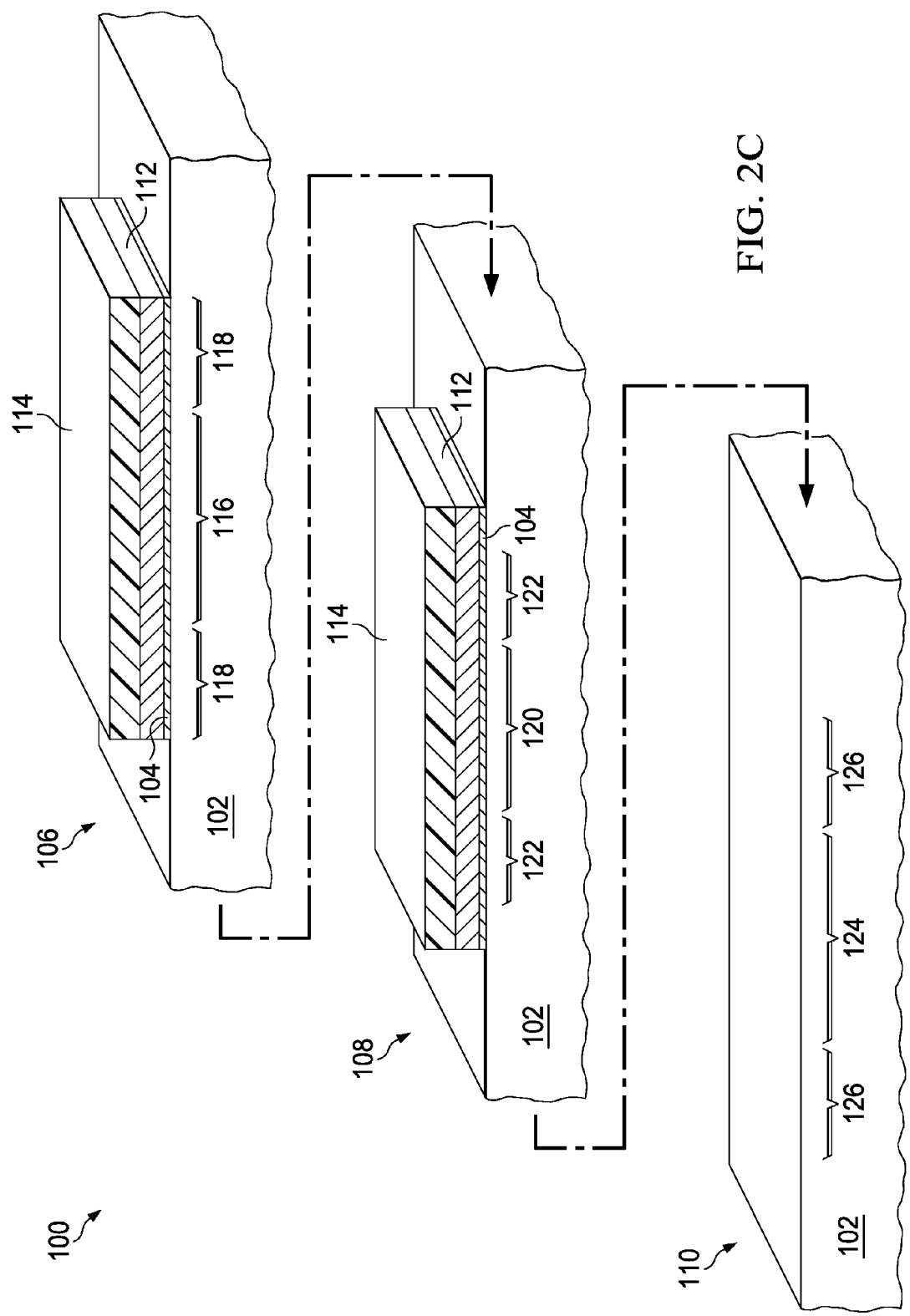

Referring to FIG. 2C, a first etch process removes the middle thin film layer 112 and the bottom thin film layer 104 from areas exposed by the first etch mask 114. The first etch process may include a first etch step which removes primarily the middle thin film layer 112 and a second etch step which removes primarily the bottom thin film layer 104. In the instant example depicted in FIG. 2C, the bottom thin film layer 104 and the middle thin film layer 112 remain in the area for the first body 116, the areas for the first heads 118, the area for the second body 120 and the areas for the second heads 122, and the bottom thin film layer 104 and the middle thin film layer 112 are removed from the area for the third body 124 and the areas for the third heads 126. Alternatively, the first etch process may leave a portion of the bottom thin film layer 104 in the area for the third body 124 and the areas for the third heads 126, and remaining resistive material of the bottom thin film layer 104 is later removed from outside the first resistor 106, the second resistor 108 and the third resistor 110.

Figure 2D:
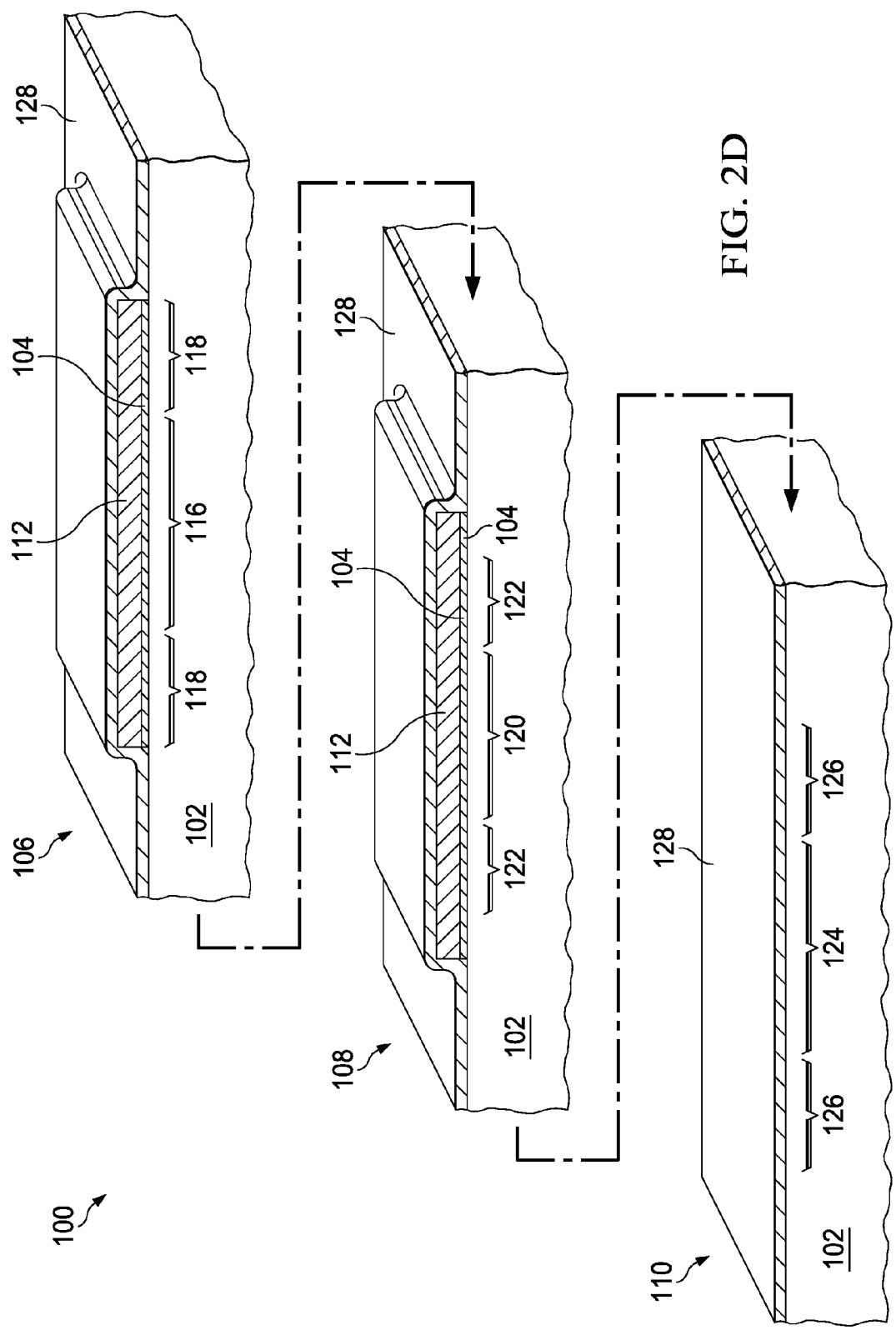

Referring to FIG. 2D, the top thin film layer 128 is formed over an existing top surface of the integrated circuit 100 and makes electrical connection to the middle thin film layer 112 at least in the areas for the first heads 118, the area for the second body 120 and the areas for the second heads 122. The top thin film layer 128 may be, for example, 10 to 100 nanometers of resistive material, with a sheet resistance, for example, of 20 to 2000 ohms per square. In one example, the top thin film layer 128 may be 40 nanometers of carbon doped silicon chromium with a sheet resistance of 100 ohms per square. Other materials that may be used for the top thin film layer 128 include, for example, silicon chromium, nickel chromium, nickel chromium aluminum, nitrogen doped silicon chromium formed by reactive sputtering, and oxygen doped silicon chromium formed by reactive sputtering. Optionally, one or more adhesion layers and/or cap layers may be formed below and/or above, respectively, the top thin film layer 128.

Figure 2E:
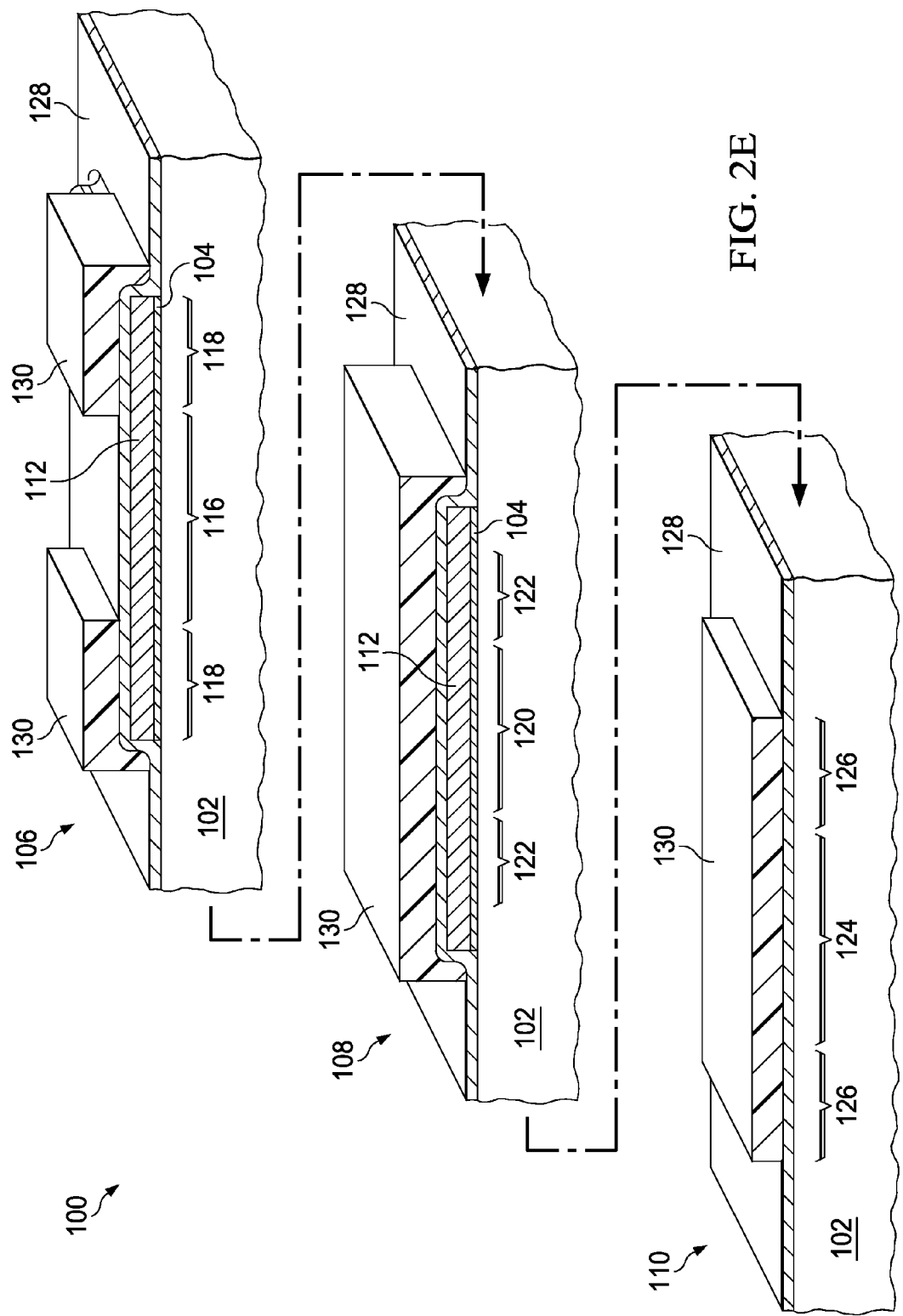

Referring to FIG. 2E, a second etch mask 130 is formed over the top thin film layer 128. The second etch mask 130 covers the areas for the first heads 118, the area for the second body 120, the areas for the second heads 122, the area for the third body 124 and the areas for the third heads 126. The second etch mask 130 may overlap ends of the areas for the first heads 118 as depicted in FIG. 2E, or may be recessed from edges of the areas for the first heads 118. The second etch mask 130 may overlap the area for the second body 120 and the areas for the second heads 122 as depicted in FIG. 2E or alternatively may be recessed from the area for the second body 120 and the areas for the second heads 122. The second etch mask 130 may include photoresist and/or one or more layers of hard mask material.

Figure 2F:
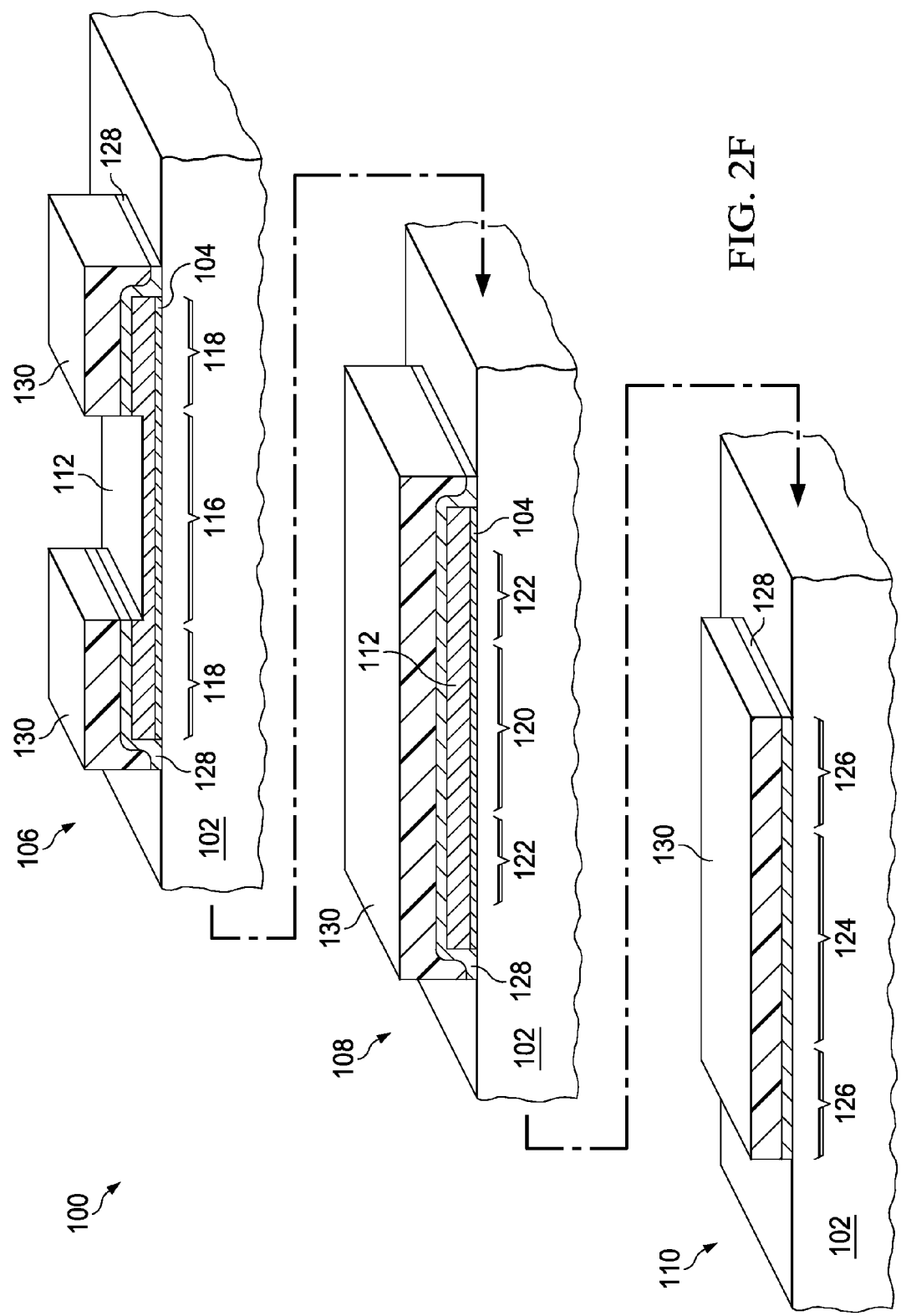

Referring to FIG. 2F, a first etch step of a second etch process removes the top thin film layer 128 and possibly a portion of the middle thin film layer 112 from areas exposed by the second etch mask 130. The first etch step of the second etch process may include, for example, a reactive ion etch (RIE) process. The first etch step also removes any remaining resistive material of the bottom thin film layer 104 outside of the first resistor 106, the second resistor 108 and the third resistor 110, as described in reference to FIG. 2C.

Figure 2G:
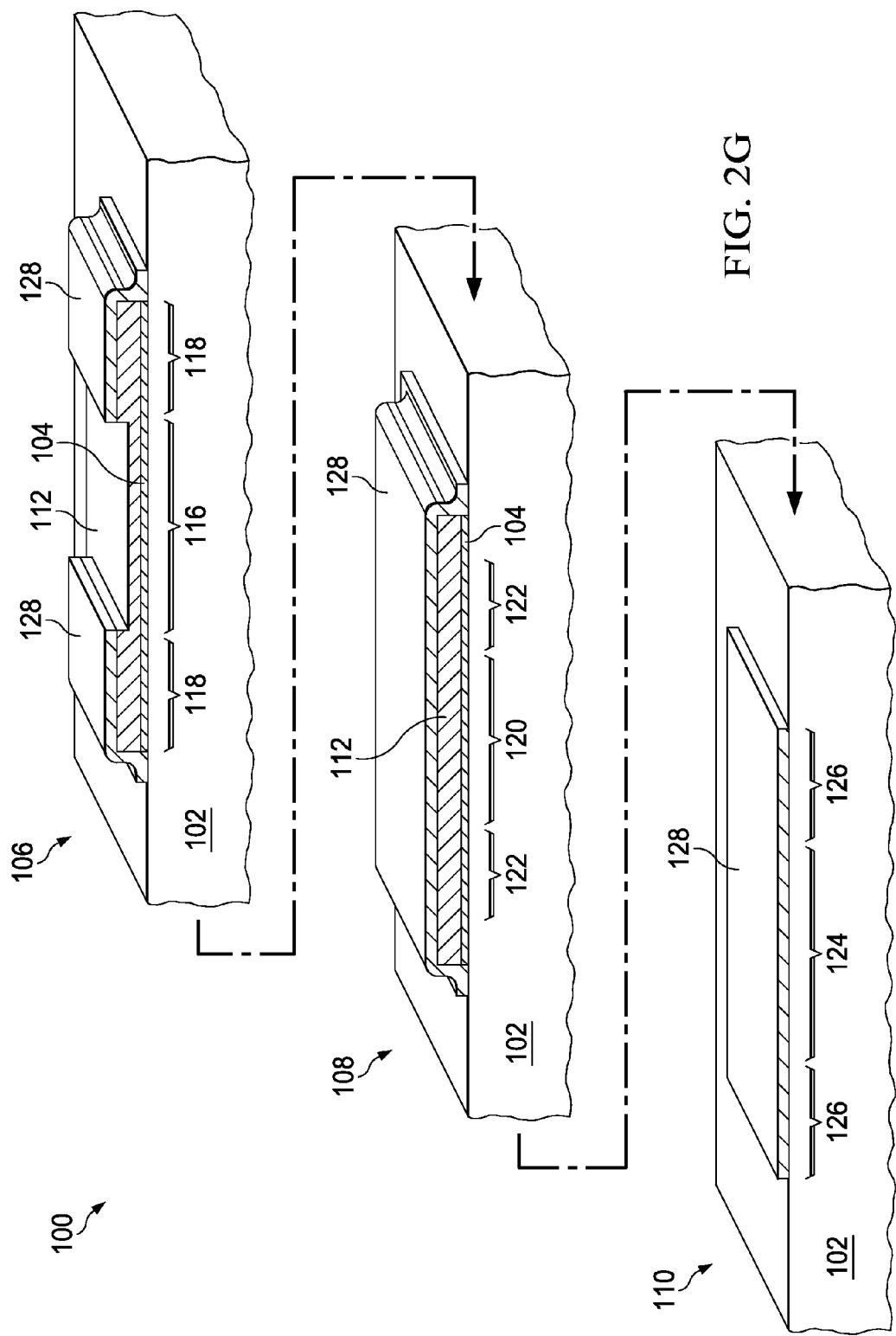

Referring to FIG. 2G, the second etch mask 130 may optionally be removed before removing the remaining middle thin film layer 112. In versions of the instant example in which the second etch mask includes photoresist or other organic polymers, the organic material may be removed, for example, using an oxygen plasma ash or an ozone ash process. In versions in which the second etch mask includes inorganic material such as silicon dioxide, the inorganic material may be removed, for example, using a fluorine-containing plasma etch process. Alternatively, the inorganic material may be left in place.

Figure 2H:
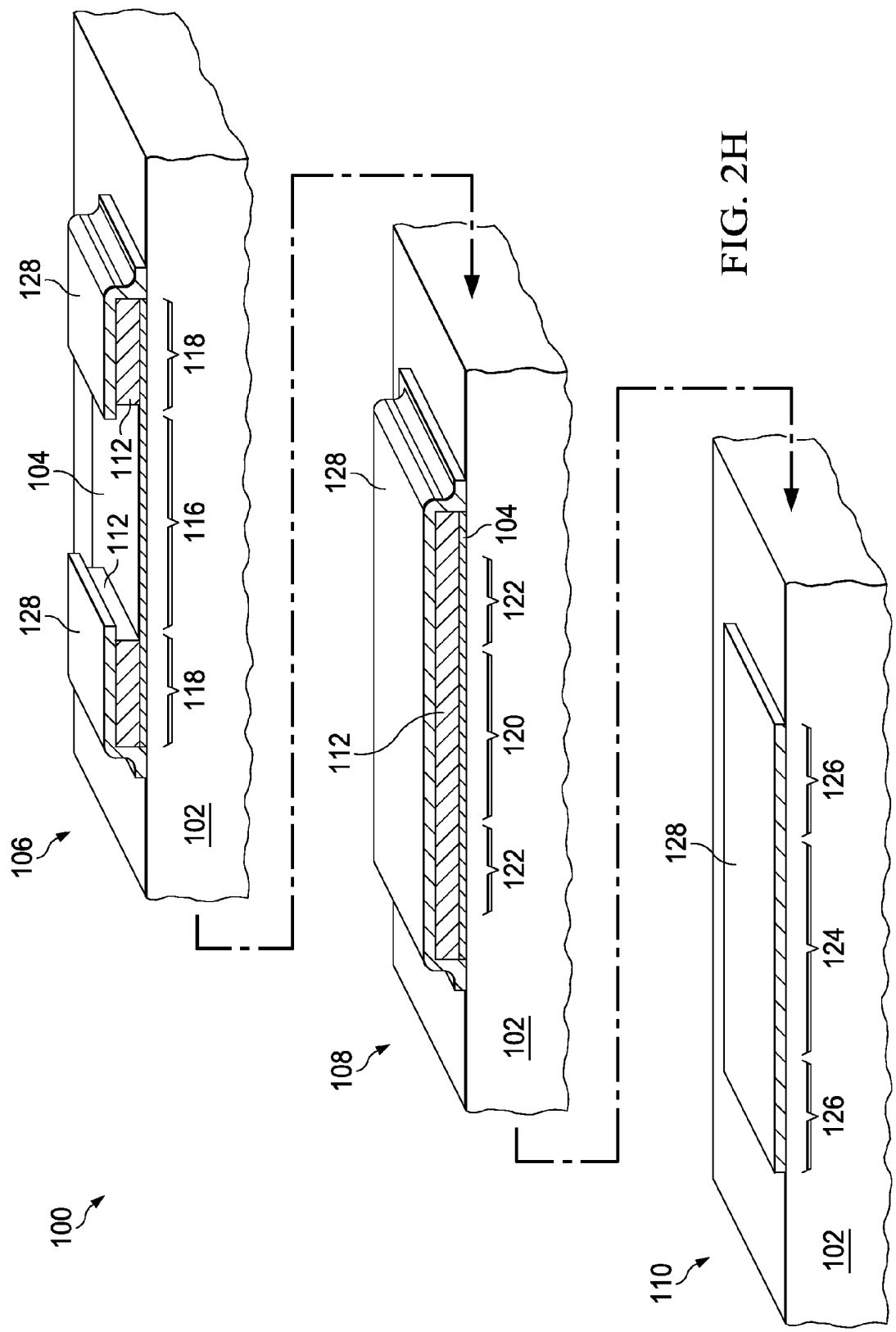

Referring to FIG. 2H, a second etch step of the second etch process removes the remaining middle thin film layer 112 from the areas that were exposed by the second etch mask 130. The second etch step has a high selectivity for the middle thin film layer 112 with respect to the bottom thin film layer 104, so that a portion, in some versions substantially all, of the bottom thin film layer 104 remains in the area for the first body 116. The second etch step may include, for example, a wet etch which undercuts the top thin film layer 128 so that lateral surfaces of the middle thin film layer 112 are recessed from corresponding edges of the top thin film layer 128, as depicted in FIG. 2H. In versions of the instant example in which the middle thin film layer 112 is titanium nitride and the bottom thin film layer 104 is silicon chromium, the second etch step may include a wet etch process using an aqueous solution of hydrogen peroxide or an aqueous mixture of hydrogen peroxide and ammonium hydroxide. In another version, in which the middle thin film layer 112 is titanium nitride over a thin layer of titanium, the second etch step may include a first wet etch process using an aqueous solution of hydrogen peroxide to remove the titanium nitride and a second wet etch step using an aqueous mixture of hydrogen peroxide and ammonium hydroxide to remove the thin titanium layer.

In the instant example, after the second step is completed, the area for the first body 116 contains the bottom thin film layer 104 and is substantially free of the middle thin film layer 112 and the top thin film layer 128; the areas for the first heads 118 contain the bottom thin film layer 104, the middle thin film layer 112 and the top thin film layer 128; the area for the second body 120 and the areas for the second heads 122 contain the bottom thin film layer 104, the middle thin film layer 112 and the top thin film layer 128; and the area for the third body 124 and the areas for the third heads 126 contain the top thin film layer 128 and are substantially free of the bottom thin film layer 104 and the middle thin film layer 112. The top thin film layer 128 overlaps the middle thin film layer 112 and the bottom thin film layer 104 at ends of the areas for the first heads 118.

Forming the first resistor 106, the second resistor 108 and the third resistor 110 using two etch masks may advantageously reduce fabrication cost and complexity of the integrated circuit 100. Forming the first body 116 to be substantially free of the middle thin film layer 112 and the top thin film layer 128, forming the second body 120 to include the middle thin film layer 112 and forming the third body 124 to include the top thin film layer 128 and be substantially free of the middle thin film layer 112 may advantageously provide the first resistor 106, the second resistor 108 and the third resistor 110 with a wide range of resistances. It will be recognized that any of the first resistor 106, the second resistor 108 and the third resistor 110 may have shapes different than those depicted in the Figures. For example, the first resistor 106, the second resistor 108 and/or the third resistor 110 may be wide, narrow, serpentine, spiral or other shape.

Figure 3A:
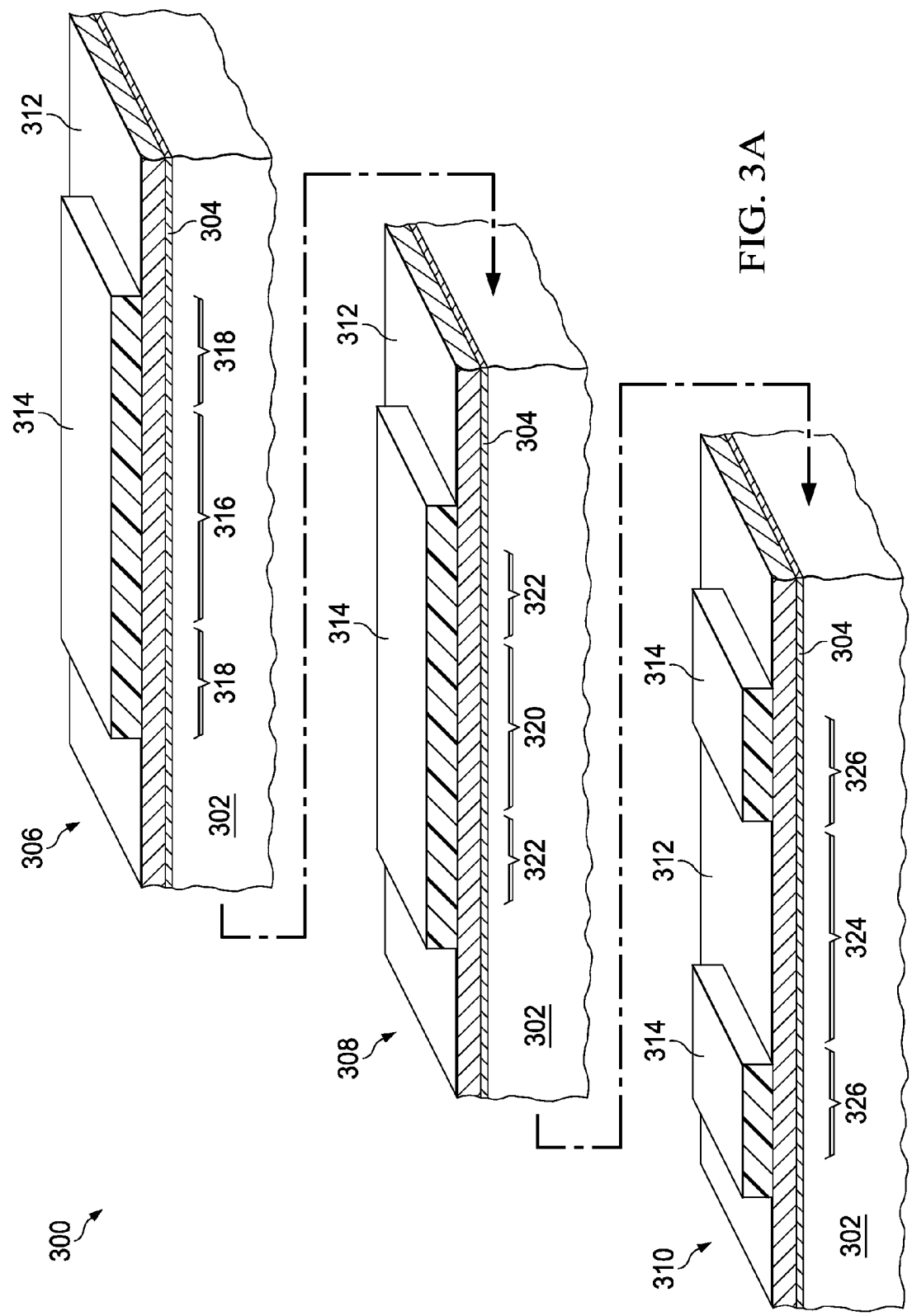
FIG. 3A through FIG. 3I are cross sections of another integrated circuit containing three thin film resistors, depicted in successive stages of fabrication.

FIG. 3A through FIG. 3I are cross sections of another integrated circuit containing three thin film resistors, depicted in successive stages of fabrication. Referring to FIG. 3A, the integrated circuit 300 includes a first dielectric layer 302 at an existing top surface of the integrated circuit 300. A bottom thin film layer 304 is formed over the first dielectric layer 302 in an area for a first resistor 306, a second resistor 308 and a third resistor 310, and a middle thin film layer 312 is formed over the bottom thin film layer 304 and makes electrical connection to the bottom thin film layer 304, as described in reference to FIG. 2A and FIG. 2B. The bottom thin film layer 304 and the middle thin film layer 312 may be formed and have properties as described in reference to FIG. 2A and FIG. 2B.

A first etch mask 314 is formed over the middle thin film layer 312. The first etch mask covers an area for a first body 316 of the first resistor 306 and areas for first heads 318 of the first resistor 306. The first etch mask also covers an area for a second body 320 of the second resistor 308 and areas for second heads 322 of the second resistor 308. In the instant example, the first etch mask 314 further covers areas for third heads 326 of the third resistor 310 and exposes an area for a third body 324 of the third resistor 310. The first etch mask 314 may be formed as described in reference to FIG. 2B.

Figure 3B:
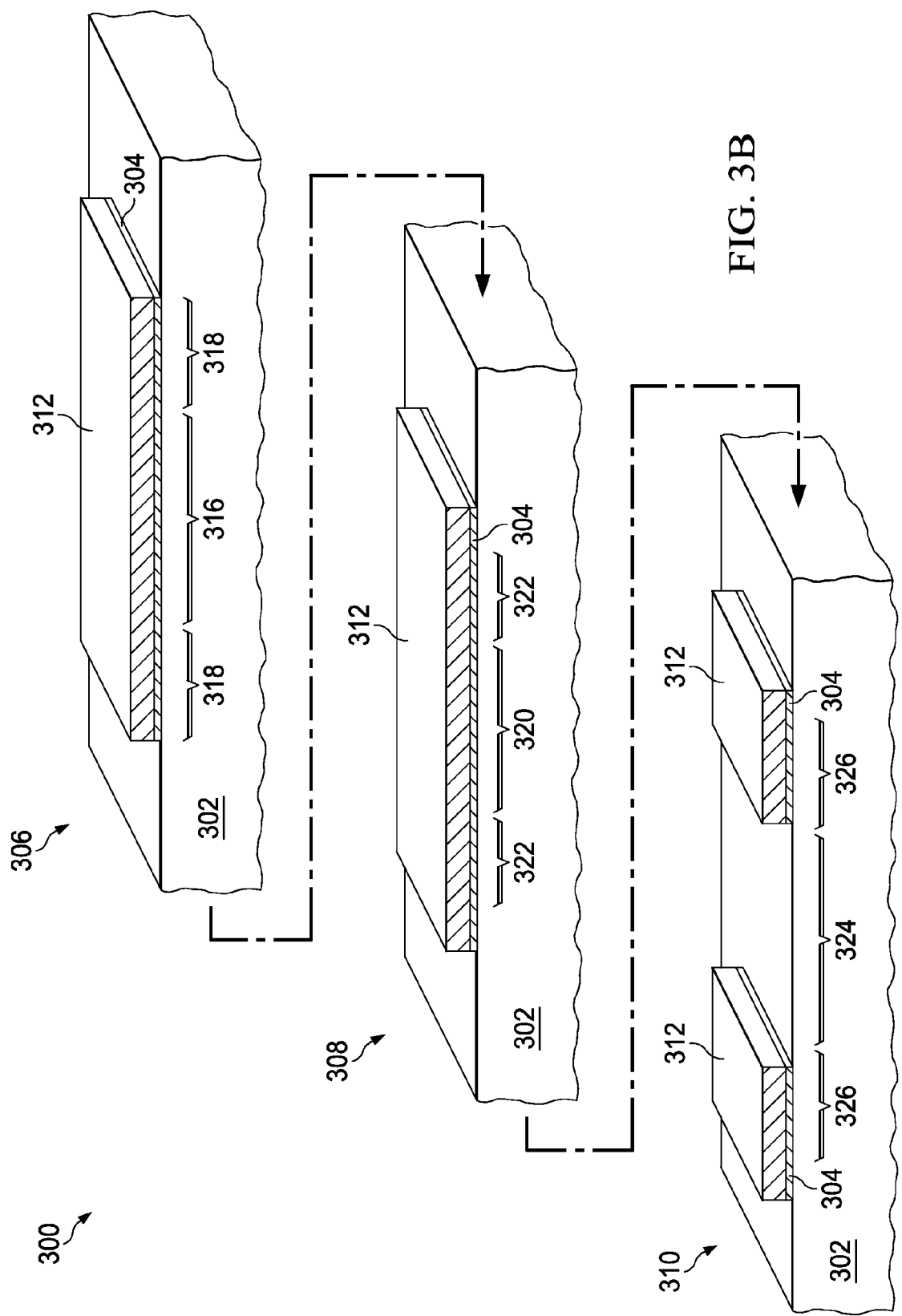

Referring to FIG. 3B, a first etch process removes the middle thin film layer 312 and the bottom thin film layer 304 from areas exposed by the first etch mask 314. The first etch mask 314 is removed after the first etch process is completed. In the instant example, the bottom thin film layer 304 and the middle thin film layer 312 remain in the area for the first body 316, the areas for the first heads 318, the area for the second body 320 and the areas for the second heads 322, and the areas for the third heads 326, and the bottom thin film layer 304 and the middle thin film layer 312 are removed from the area for the third body 324.

Figure 3C:
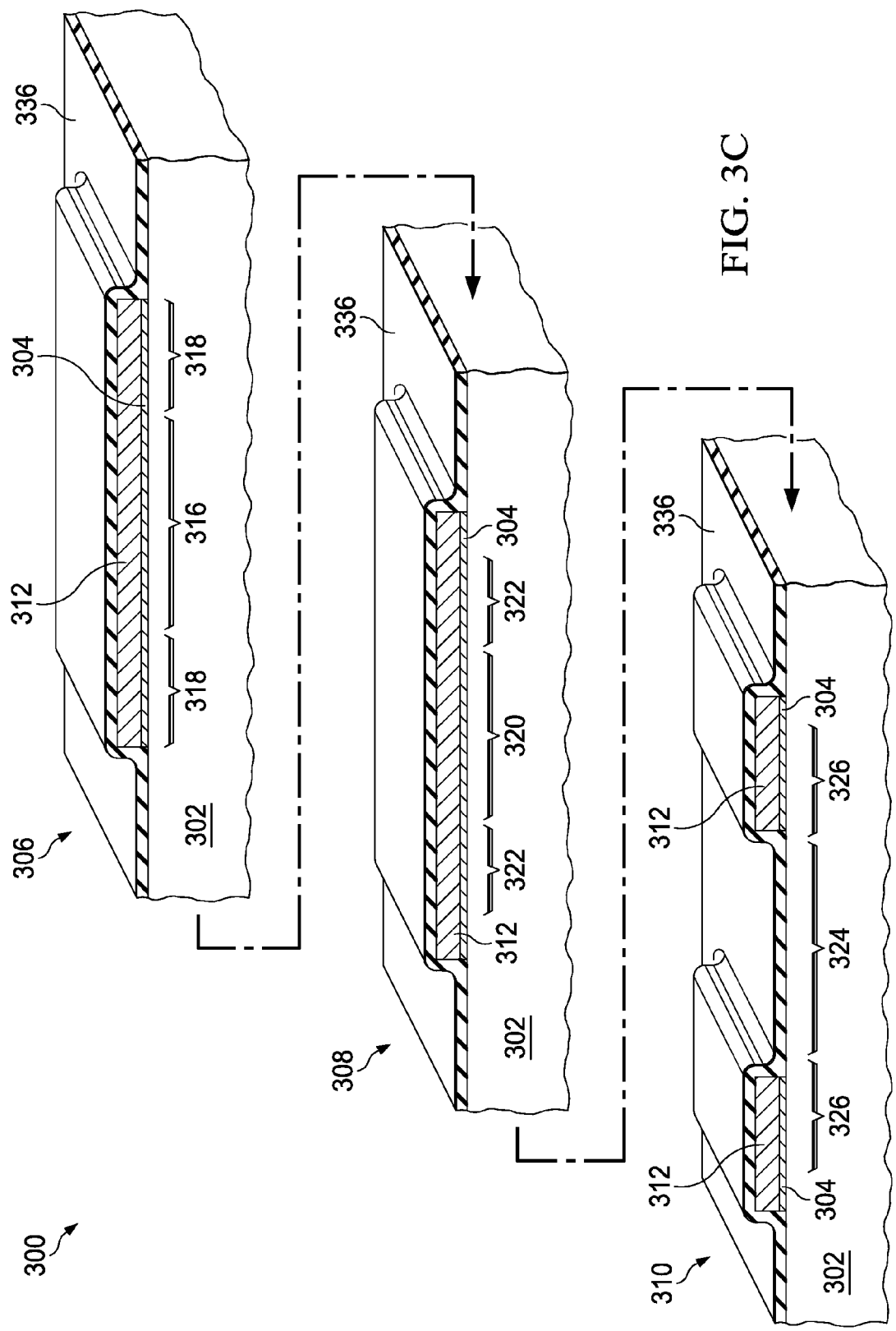

Referring to FIG. 3C, a sidewall dielectric layer 336 is conformally formed over an existing top surface of the integrated circuit 300, covering lateral surfaces of the middle thin film layer 312 and the bottom thin film layer 304. The sidewall dielectric layer 336 may include, for example, silicon dioxide formed by decomposition of TEOS, or silicon nitride formed by a plasma enhanced chemical vapor deposition (PECVD) process using silane, ammonia and nitrogen. The sidewall dielectric layer 336 may have a thickness, for example, one to three times a combined thickness of the middle thin film layer 312 and the bottom thin film layer 304.

Figure 3D:
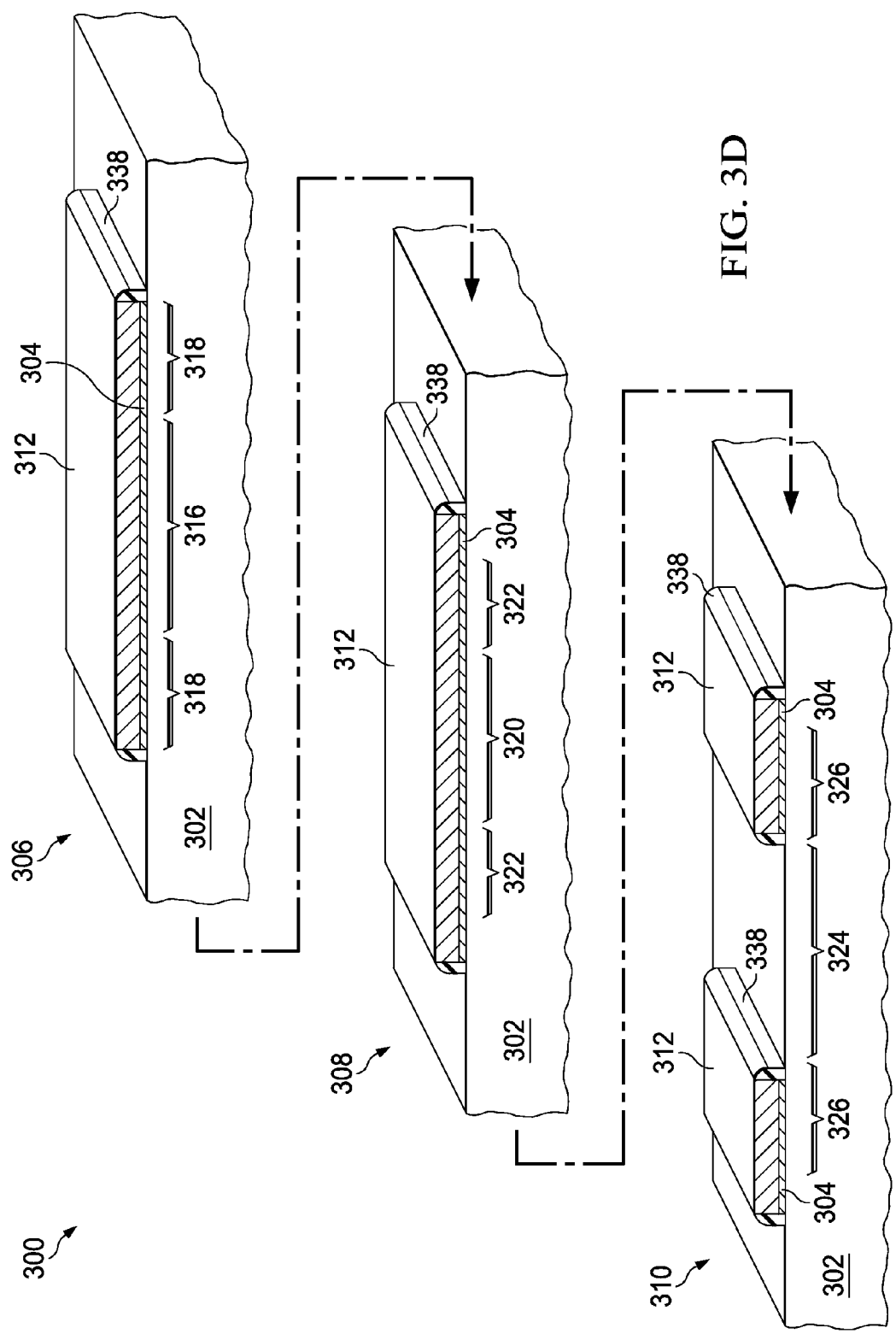

Referring to FIG. 3D, an anisotropic etch removes the sidewall dielectric layer 336 from horizontal surfaces of the middle thin film layer 312 and the first dielectric layer 302 to leave electrically insulating dielectric sidewalls 338 on the lateral surfaces of the middle thin film layer 312 and the bottom thin film layer 304. The anisotropic etch may include an RIE step using a fluorine-containing plasma that etches the sidewall dielectric layer 336 with a good selectivity with respect to the middle thin film layer 312.

Figure 3E:
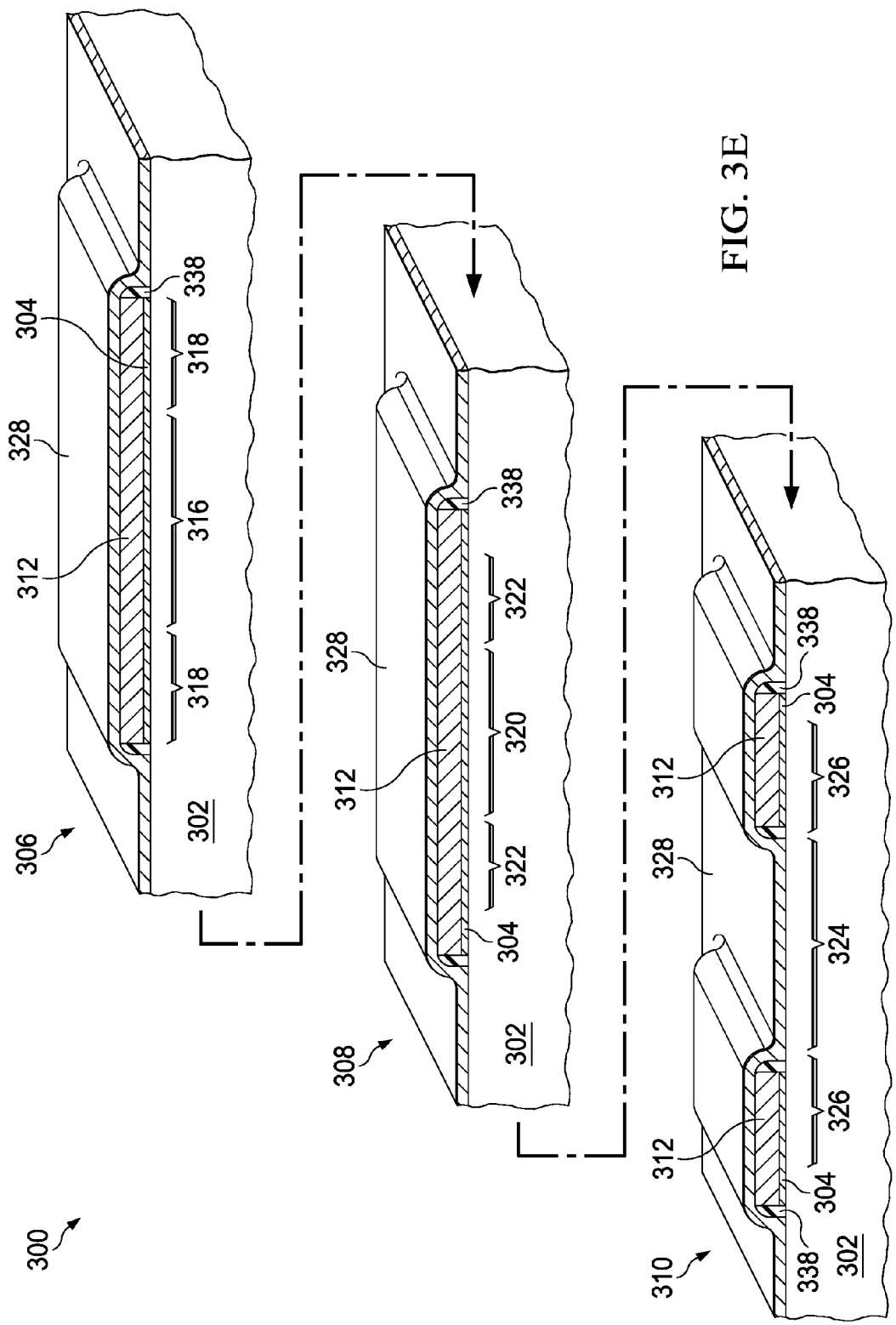

Referring to FIG. 3E, a top thin film layer 328 is formed over an existing top surface of the integrated circuit 300 and makes electrical connection to the middle thin film layer 312 in the areas for the first heads 318, the area for the second body 320 and the areas for the second heads 322, and the areas for the third heads 326. The top thin film layer 328 may be formed and have properties as described in reference to FIG. 2D. The top thin film layer 328 is separated from lateral sides of the bottom thin film layer 304 by the dielectric sidewalls 338.

Figure 3F:
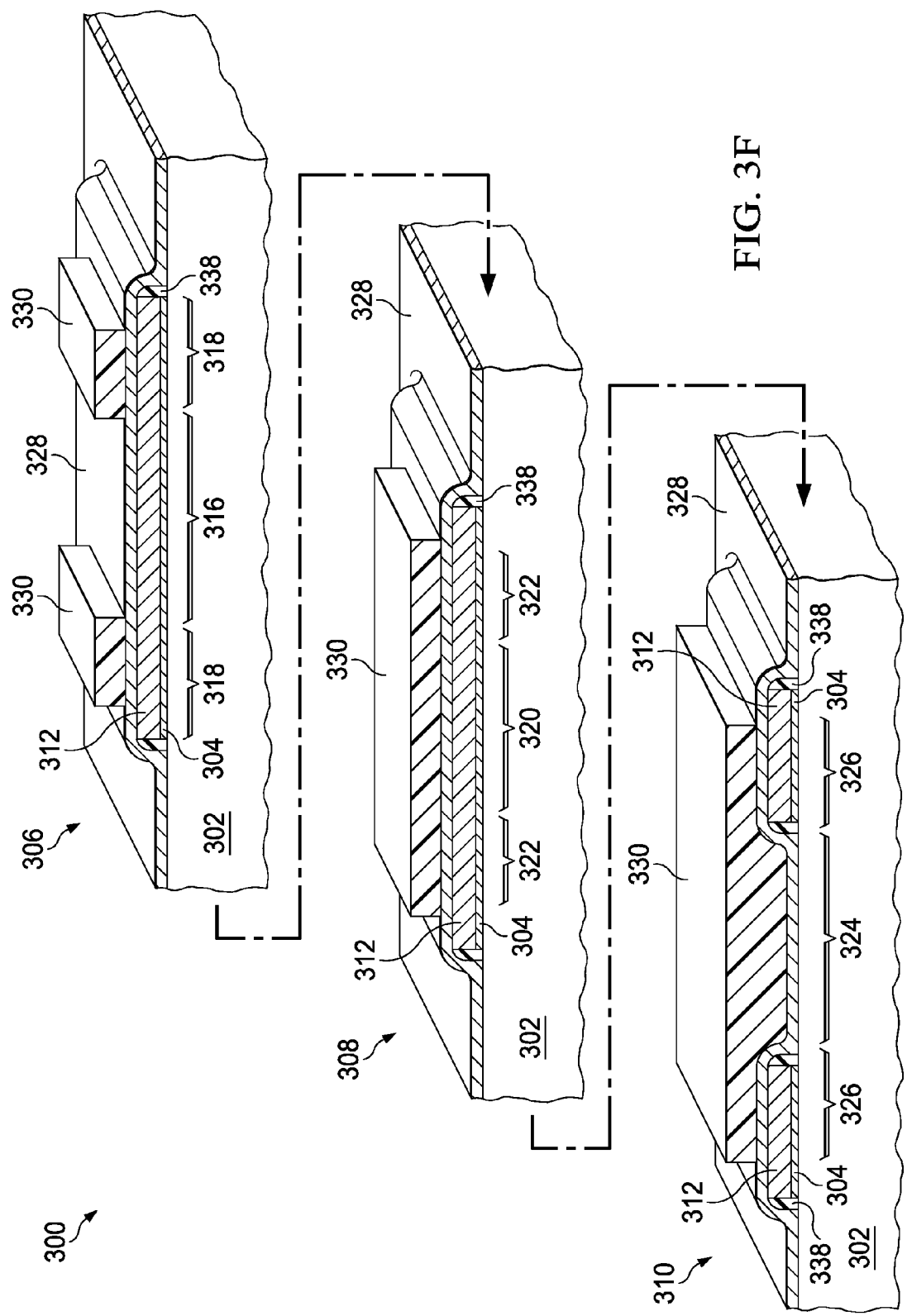

Referring to FIG. 3F, a second etch mask 330 is formed over the top thin film layer 128. The second etch mask 330 covers the areas for the first heads 318, the areas for the second body 320 and the second heads 322, and the areas for the third body 324 and the third heads 326. In the instant example, the second etch mask 330 does not overlap the middle thin film layer 312 in the area for the first resistor 306.

Figure 3G:
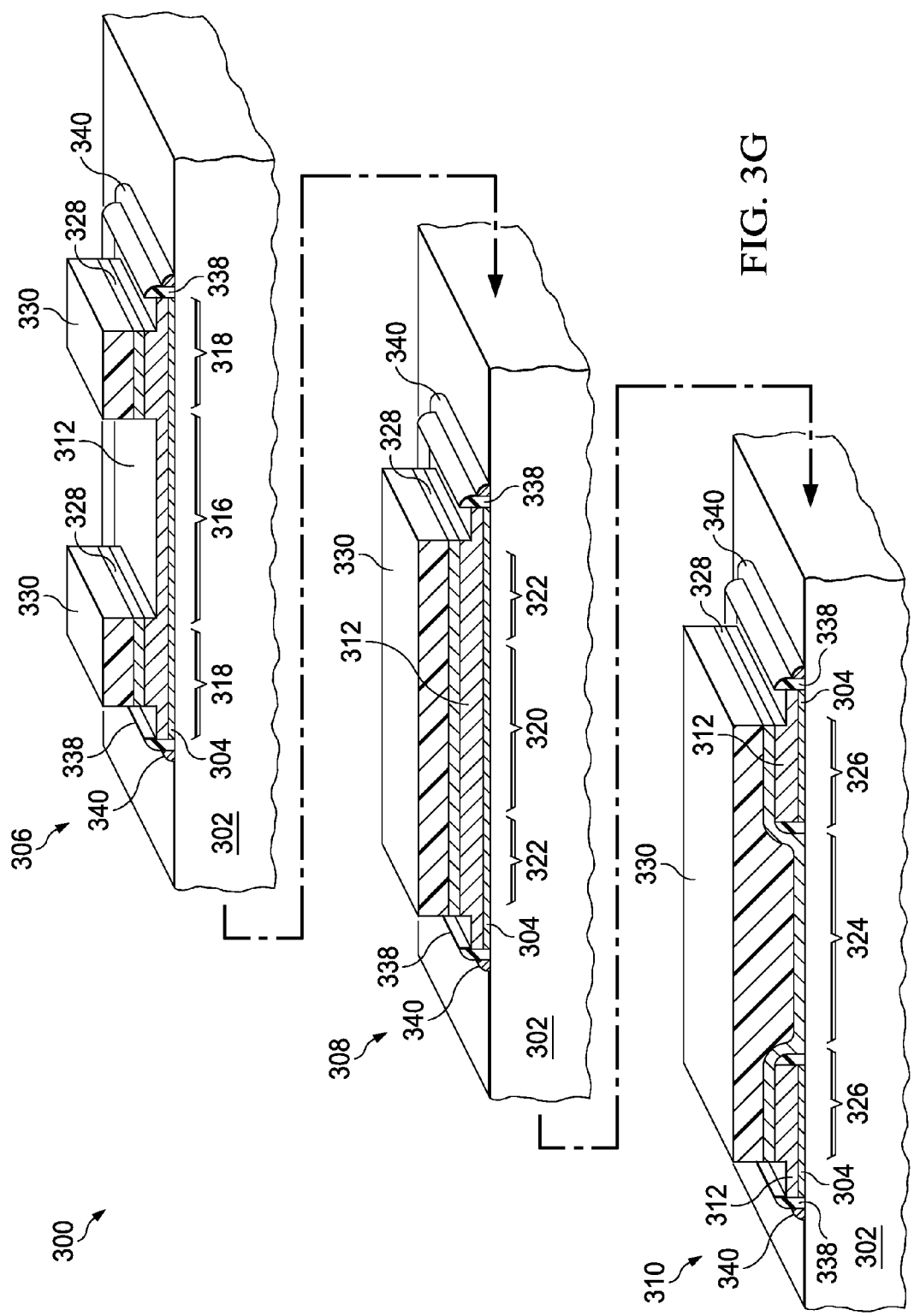

Referring to FIG. 3G, a first etch step of a second etch process removes the top thin film layer 328 and possibly a portion of the middle thin film layer 312 from areas exposed by the second etch mask 330, as described in reference to FIG. 2F. The first etch step may possibly leave a filament 340 of the top thin film layer 328 abutting the dielectric sidewalls 338. The bottom thin film layer 304 in the area for the first resistor 306 is electrically isolated from the filament 340 so that a resistance of the first resistor is advantageously not affected by the presence of the filament 340. Forming the dielectric sidewall 338 to electrically isolate the bottom thin film layer 304 from the filament 340 may advantageously improve a process margin for the first step of the second etch process, by allowing the first step to terminate after the top thin film layer 328 has been removed from over the middle thin film layer 312 and before the filament has been removed. It will be recognized that the dielectric sidewall 338 may subsequently be partially or completely removed at a later stage of fabrication, without sacrificing the advantage of the filament 340 being isolated from bottom thin film layer 304.

Figure 3H:
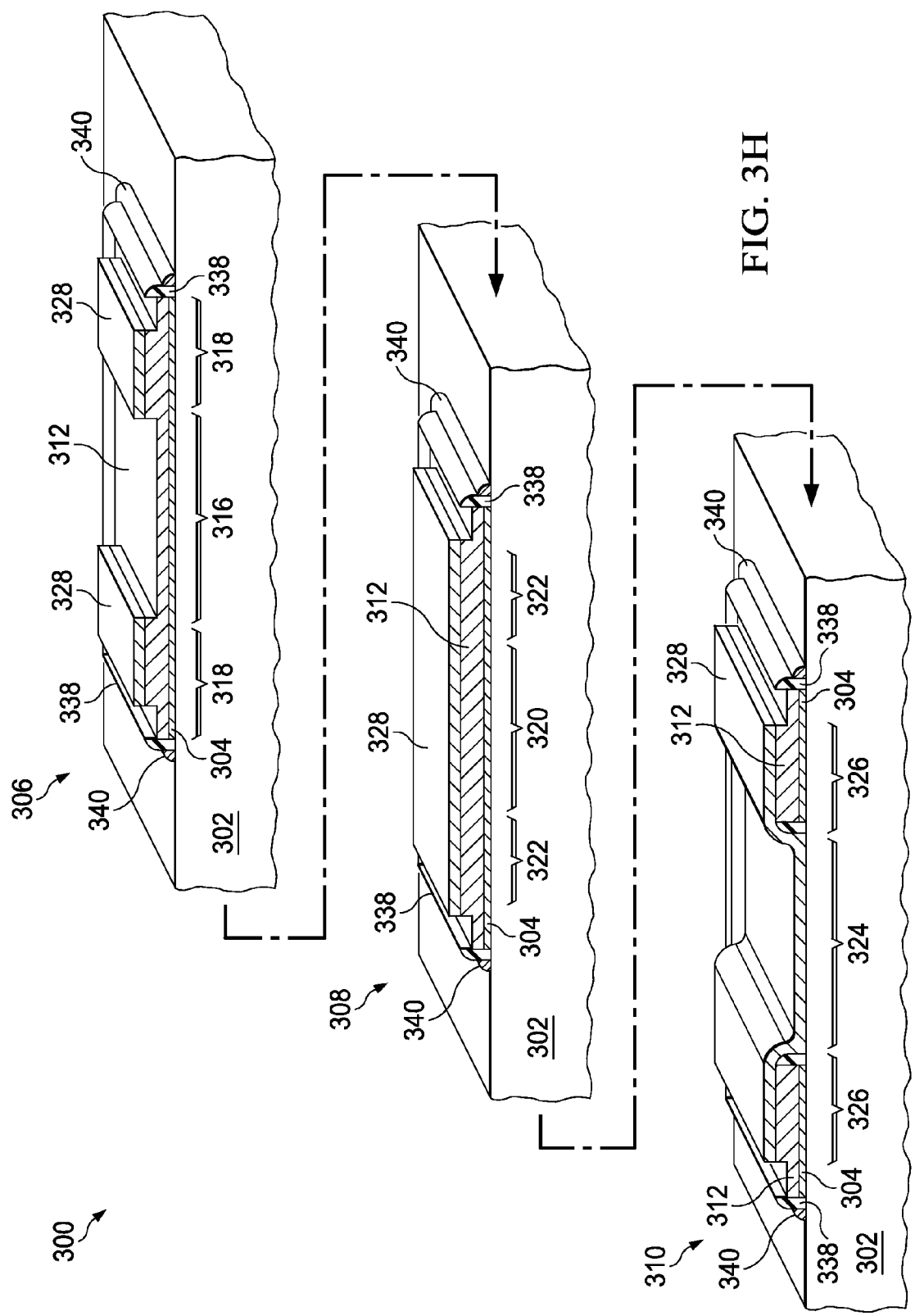

Referring to FIG. 3H, the second etch mask 330 may optionally be removed before removing the remaining middle thin film layer 312, as described in reference to FIG. 2G. The second etch mask 330 may be removed, for example, using an oxygen ash process or an ozone ash process.

Figure 3I:
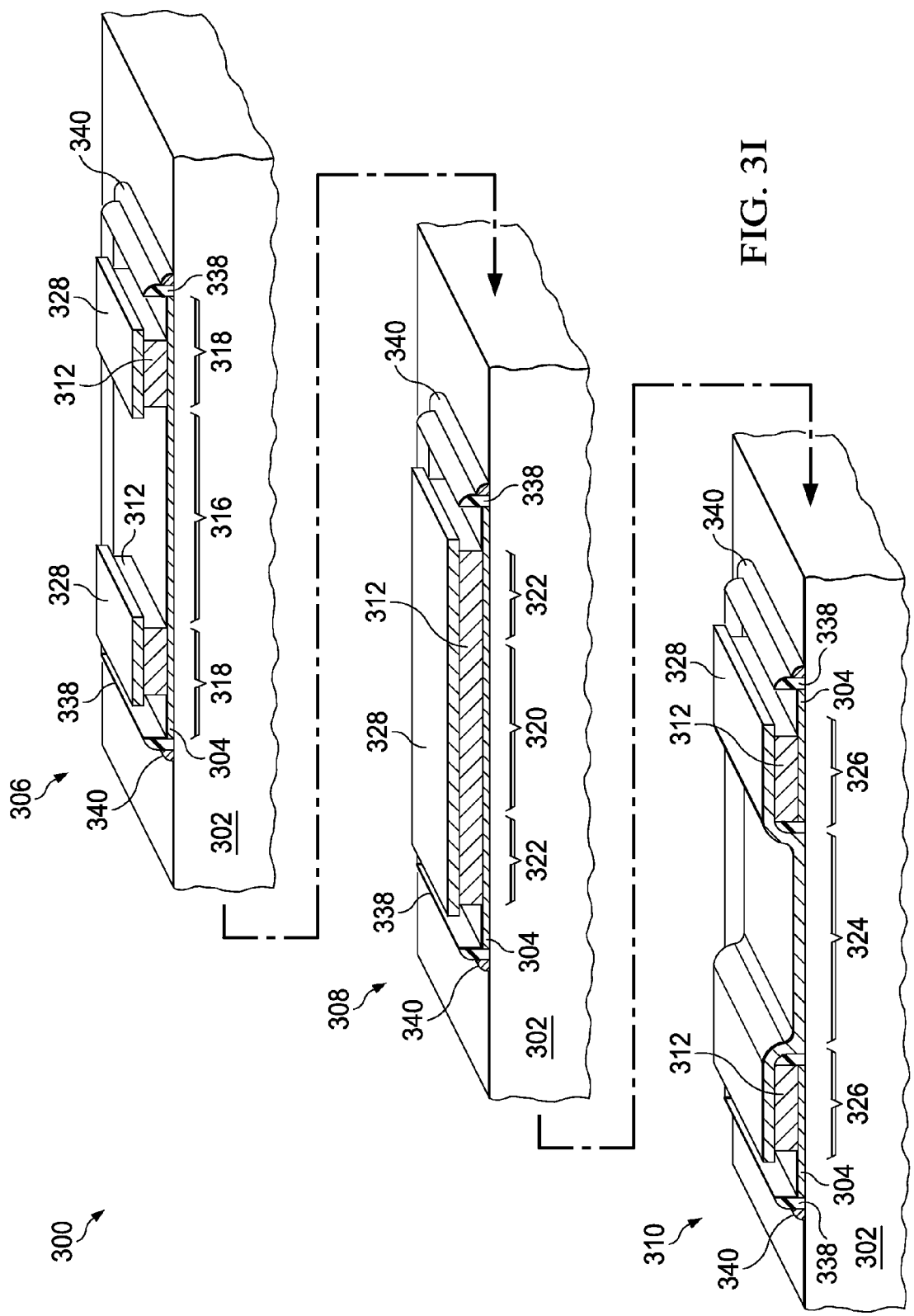

Referring to FIG. 3I, a second etch step of the second etch process removes the remaining middle thin film layer 312 from the areas that were exposed by the second etch mask 330, as described in reference to FIG. 2H. The second etch step has a high selectivity for the middle thin film layer 312 with respect to the bottom thin film layer 304, and at least a medium selectivity with respect to the top thin film layer 328, so that a portion, in some versions substantially all, of the bottom thin film layer 304 remains in the area for the first body 316. Subsequently, a second dielectric layer is formed over the first resistor 306, the second resistor 308 and the third resistor 310, and electrical connections are formed to the first resistor 306, the second resistor 308 and the third resistor 310, for example as described in reference to FIG. 1.

Figure 4A:
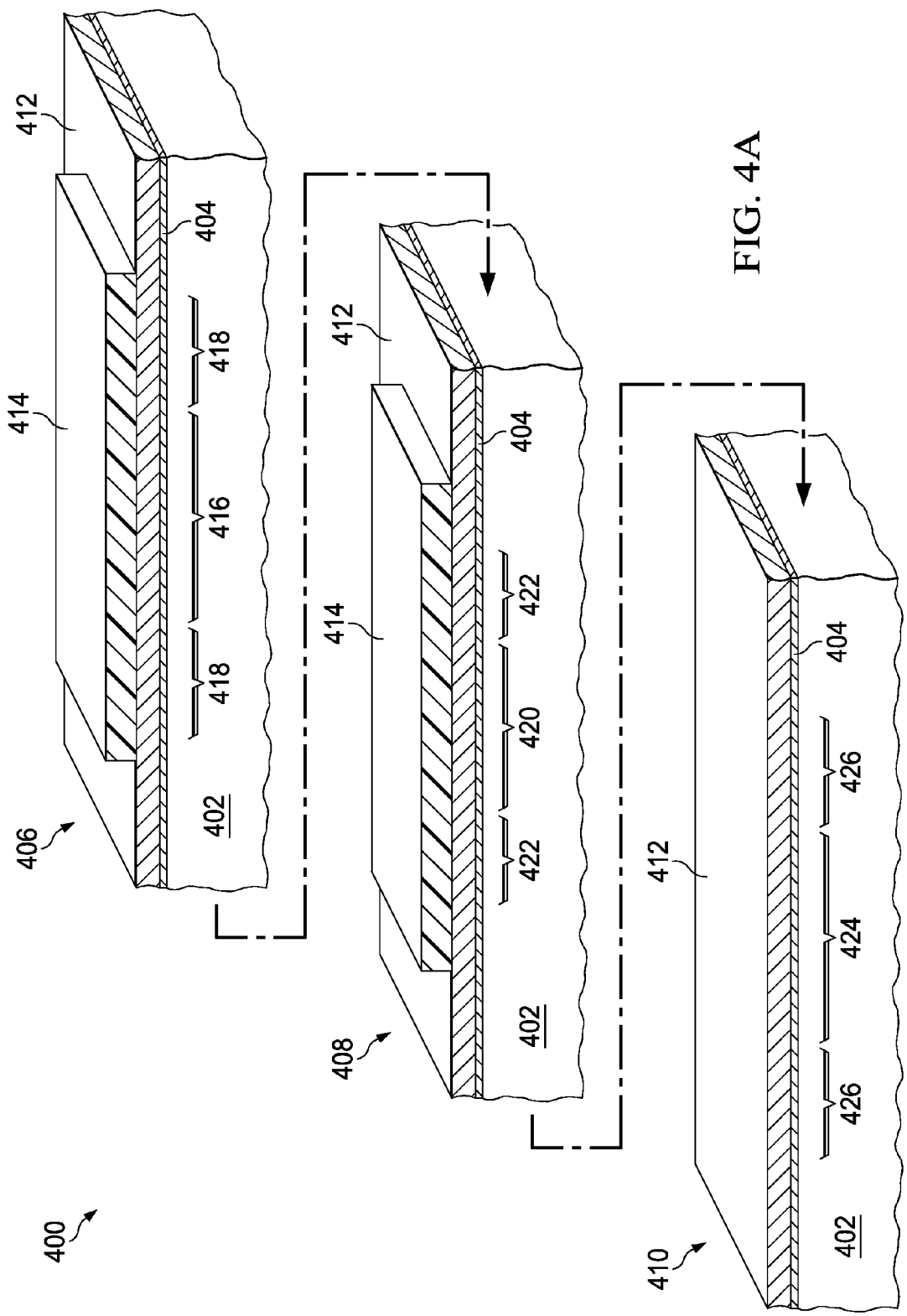
FIG. 4A through FIG. 4F are cross sections of a further integrated circuit containing three thin film resistors, depicted in successive stages of fabrication.

FIG. 4A through FIG. 4F are cross sections of a further integrated circuit containing three thin film resistors, depicted in successive stages of fabrication. Referring to FIG. 4A, the integrated circuit 400 includes a first dielectric layer 402 at an existing top surface of the integrated circuit 400. A bottom thin film layer 404 is formed over the first dielectric layer 402 in an area for a first resistor 406, a second resistor 408 and a third resistor 410, and a middle thin film layer 412 is formed over the bottom thin film layer 404 and makes electrical connection to the bottom thin film layer 404, as described in reference to FIG. 2A and FIG. 2B. The bottom thin film layer 404 and the middle thin film layer 412 may be formed and have properties as described in reference to FIG. 2A and FIG. 2B.

A first etch mask 414 is formed over the middle thin film layer 412. The first etch mask covers an area for a first body 416 of the first resistor 406 and areas for first heads 418 of the first resistor 406. The first etch mask also covers an area for a second body 420 of the second resistor 408 and areas for second heads 422 of the second resistor 408. In the instant example, the first etch mask 414 exposes an area for a third body 424 of the third resistor 410 and areas for third heads 426 of the third resistor 410. The first etch mask 414 may be formed as described in reference to FIG. 2B.

Figure 4B:
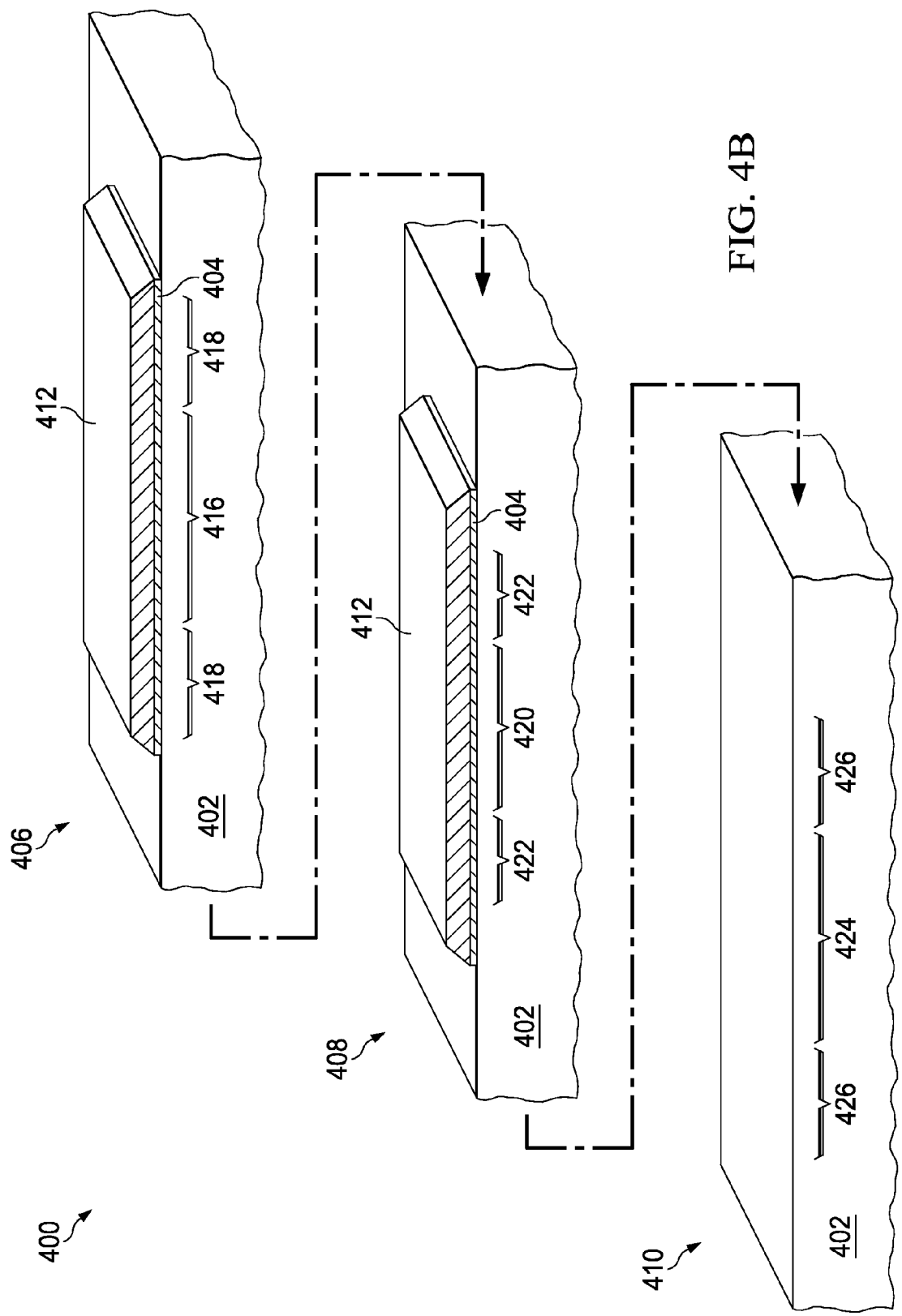

Referring to FIG. 4B, a first etch process removes the middle thin film layer 412 and the bottom thin film layer 404 from areas exposed by the first etch mask 414. The first etch process is performed so that lateral surfaces of the middle thin film layer 412 are slanted inward as depicted in FIG. 4B. The first etch process may use a plasma etch step which forms polymers at the lateral surfaces to provide the slanted profile. A separate etch step may be used to remove the bottom thin film layer 404. The first etch mask 414 is removed after the first etch process is completed. In the instant example, the bottom thin film layer 404 and the middle thin film layer 412 remain in the area for the first body 416, the areas for the first heads 418, the area for the second body 420 and the areas for the second heads 422, and the bottom thin film layer 404 and the middle thin film layer 412 are removed from the area for the third body 424 and the areas for the third heads 426.

Figure 4C:
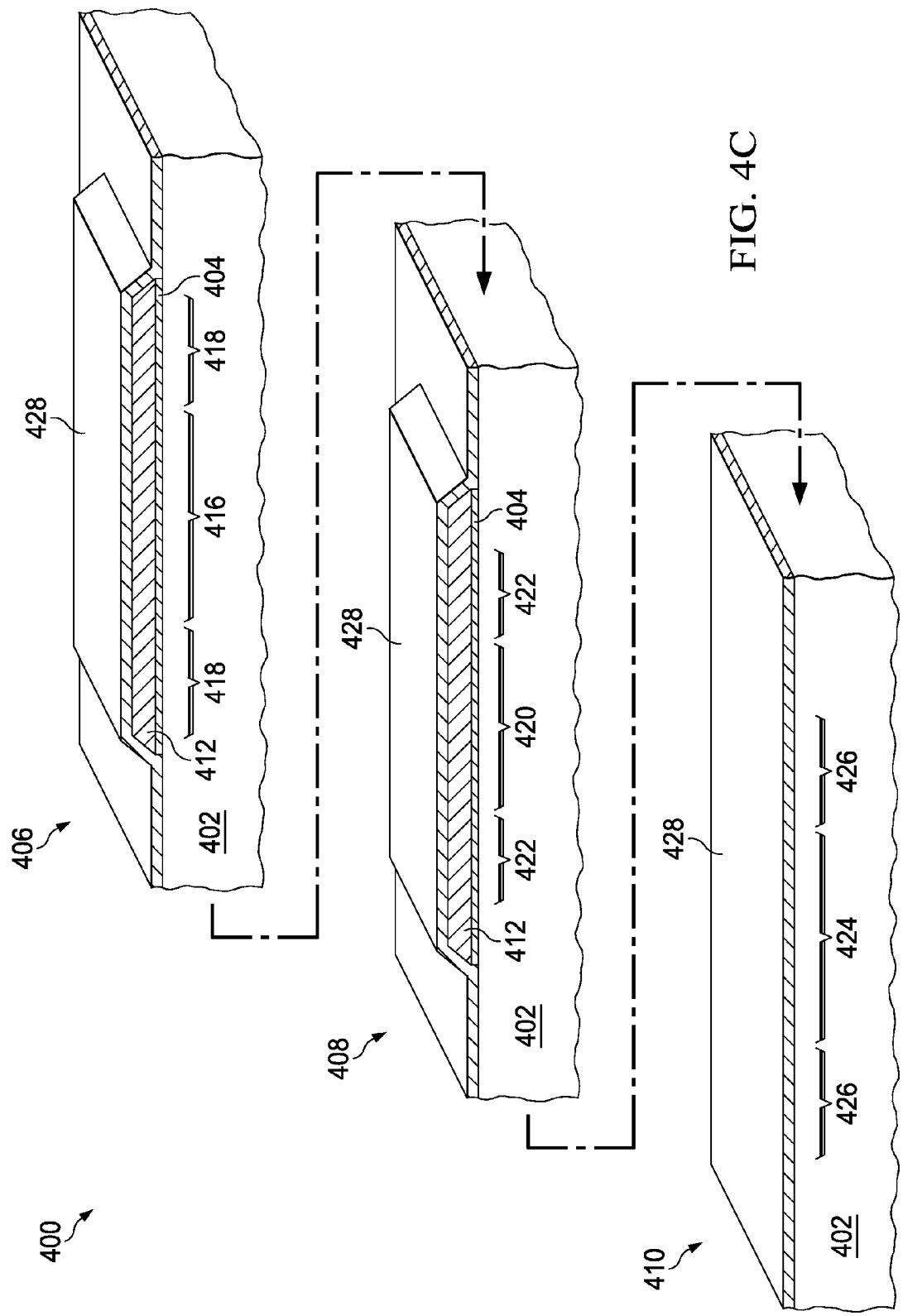

Referring to FIG. 4C, a top thin film layer 428 is formed over an existing top surface of the integrated circuit 400 and makes electrical connection to the middle thin film layer 412 in the areas for the first heads 418, the area for the second body 420 and the areas for the second heads 422. In the instant example, the top thin film layer 428 is conformal over the slanted profile of the lateral surfaces of the middle thin film layer 412. The top thin film layer 428 may be formed and have properties as described in reference to FIG. 2D.

Figure 4D:
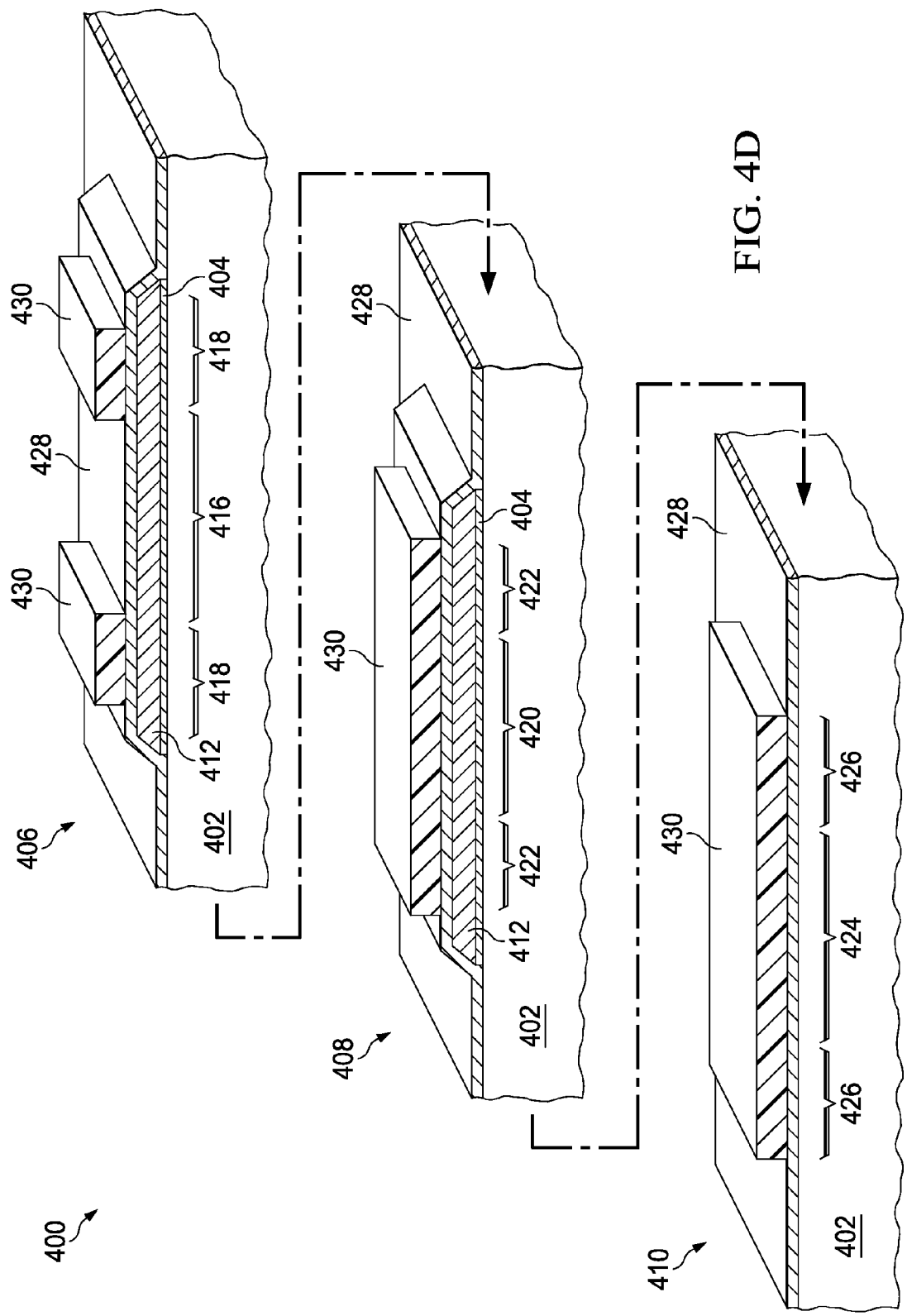

Referring to FIG. 4D, a second etch mask 430 is formed over the top thin film layer 128. The second etch mask 430 covers the areas for the first heads 418, the areas for the second body 420 and the second heads 422, and the areas for the third body 424 and the third heads 426. In the instant example, the second etch mask 430 does not overlap the middle thin film layer 412 in either the area for the first resistor 406 or in the area for the second resistor 408. The second etch mask 430 may be formed as described in reference to FIG. 2E.

Figure 4E:
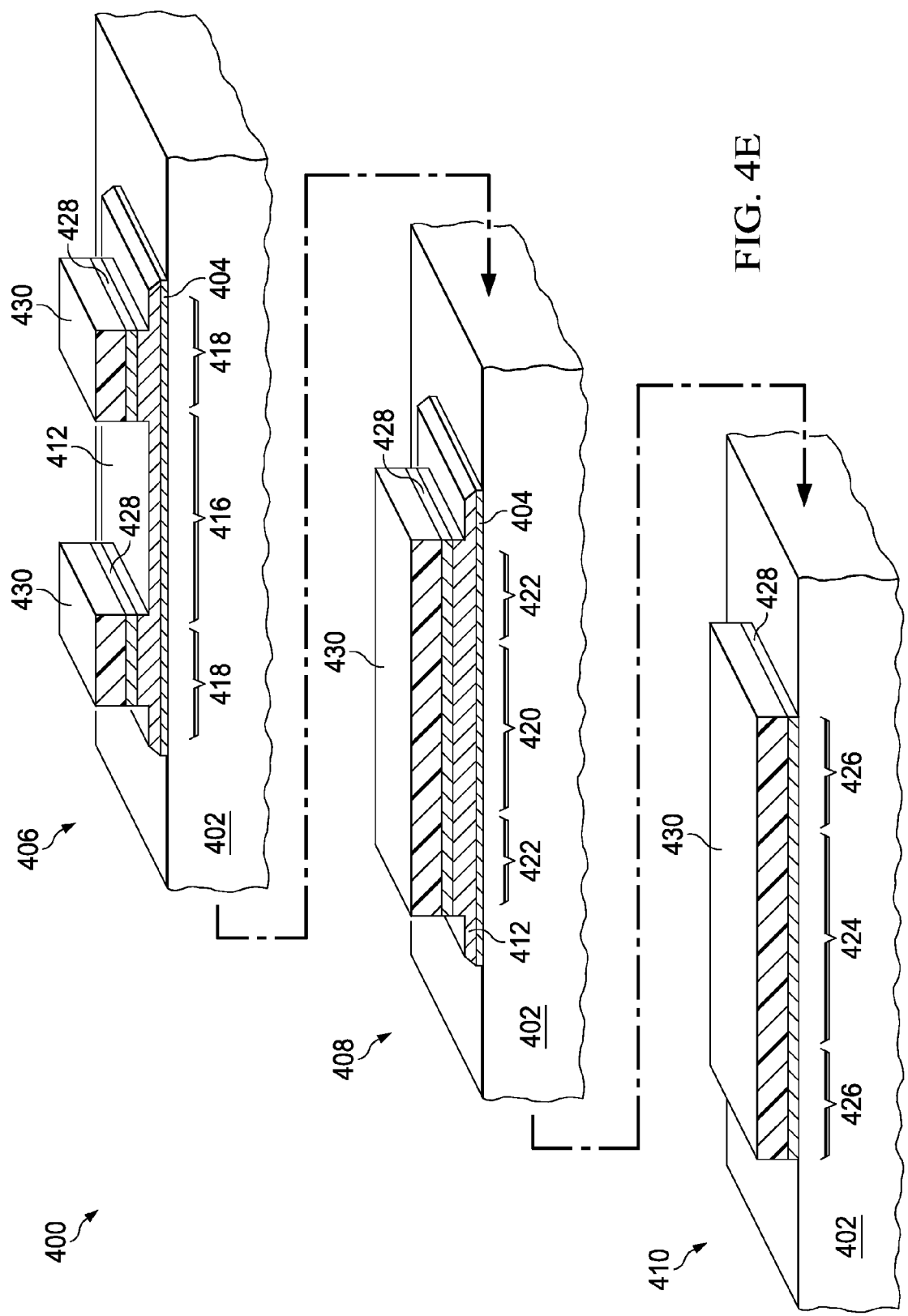

Referring to FIG. 4E, a first etch step of a second etch process removes the top thin film layer 428 and possibly a portion of the middle thin film layer 412 from areas exposed by the second etch mask 430. The first etch step of the second etch process may be performed as described in reference to FIG. 2F. The slanted profile of the lateral surfaces of the middle thin film layer 412 may advantageously allow the top thin film layer 428 to be removed without leaving a filament of the top thin film layer 428 on the first dielectric layer 402. The second etch mask 430 may optionally be removed before removing the remaining middle thin film layer 412, as described in reference to FIG. 2G.

Figure 4F:
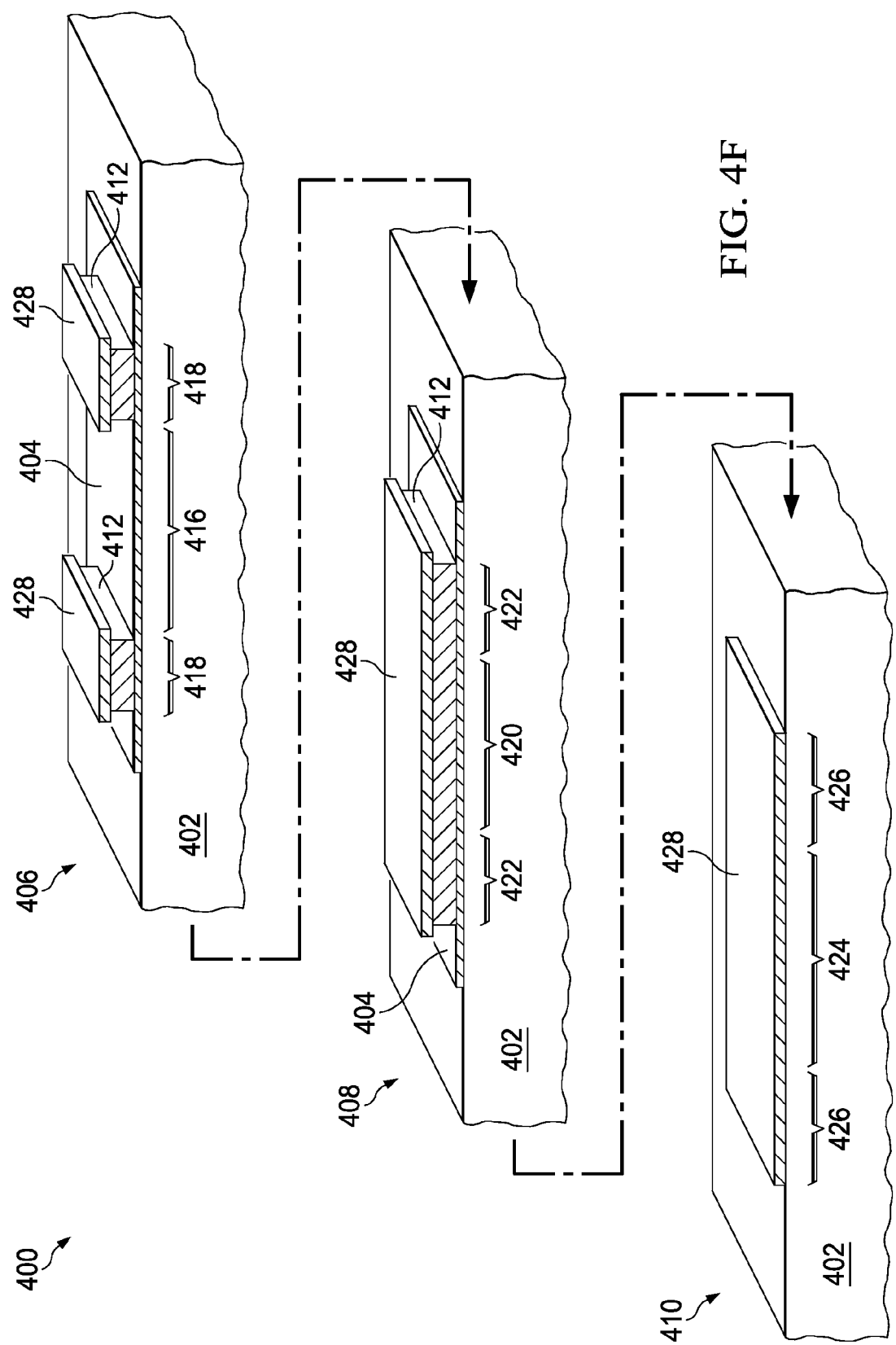

Referring to FIG. 4F, a second etch step of the second etch process removes the remaining middle thin film layer 412 from the areas that were exposed by the second etch mask 430. The second etch step has a high selectivity for the middle thin film layer 412 with respect to the bottom thin film layer 404, as described in reference to FIG. 2H, so that a portion, possibly substantially all, of the bottom thin film layer 404 remains in the area for the first body 416. Subsequently, a second dielectric layer is formed over the first resistor 406, the second resistor 408 and the third resistor 410, and electrical connections are formed to the first resistor 406, the second resistor 408 and the third resistor 410, for example as described in reference to FIG. 1.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
    a dielectric layer;
    a first resistor disposed over said dielectric layer, said first resistor including a first body and first heads, said first body including a bottom thin film layer and being free of a middle thin film layer and a top thin film layer, said first heads including said bottom thin film layer, said middle thin film layer disposed over and making electrical connection to said bottom thin film layer, and said top thin film layer disposed over and making electrical connection to said middle thin film layer;
    a second resistor over said dielectric layer, said second resistor including a second body and second heads, said second body and said second heads including said bottom thin film layer, said middle thin film layer and said top thin film layer; and
    a third resistor disposed over said dielectric layer, said third resistor including a third body and third heads, said third body including said top thin film layer and being free of said middle thin film layer.

2. The integrated circuit of claim 1, in which:
    said bottom thin film layer includes carbon-doped silicon chromium 2 to 20 nanometers thick;
    said middle thin film layer includes titanium nitride 20 to 200 nanometers thick; and
    said top thin film layer includes carbon-doped silicon chromium 10 to 100 nanometers thick.

3. The integrated circuit of claim 1, in which said top thin film layer extends over ends of both said middle thin film layer and said bottom thin film layer at edges of said first heads.

4. The integrated circuit of claim 1, in which a dielectric sidewall is disposed on said dielectric layer around said first resistor.

5. The integrated circuit of claim 4, in which a filament of said top thin film layer is laterally separated from said first body by said dielectric sidewall.

6. The integrated circuit of claim 1, in which lateral surfaces of said middle thin film layer are recessed from corresponding edges of said top thin film layer in said first heads.

7. The integrated circuit of claim 1, in which said top thin film layer extends over ends of both said middle thin film layer and said bottom thin film layer at edges of said second heads and said second body.

8. The integrated circuit of claim 1, in which lateral surfaces of said middle thin film layer are recessed from corresponding edges of said top thin film layer in said second heads and said second body.

9. The integrated circuit of claim 1, in which said third heads include said middle thin film layer and said bottom thin film layer.

10. The integrated circuit of claim 1, in which said third body is free of said bottom thin film layer, and said third heads are free of said bottom thin film layer and said middle thin film layer.

11. A method of forming an integrated circuit, comprising the steps of:
    forming a dielectric layer at an existing top surface of said integrated circuit;
    forming a bottom thin film layer over said dielectric layer;
    forming a middle thin film layer over said bottom thin film layer, said middle thin film layer making electrical connection to said bottom thin film layer;
    removing said middle thin film layer and said bottom thin film layer in an area for a third body of a third resistor and leaving said middle thin film layer and said bottom thin film layer in an area for a first body and areas for first heads of a first resistor, and in an area for a second body and areas for second heads of a second resistor;
    forming a top thin film layer over an existing top surface of said integrated circuit, said top thin film layer making electrical connection to said middle thin film layer; and
    removing said top thin film layer and said middle thin film layer in said area for said first body, and leaving said top thin film in said areas for said first heads, said area for said second body, said areas for said second heads, said area for said third body and areas for third heads of said third resistor, and leaving said bottom thin film layer in said area for said first body.

12. The method of claim 11, in which:
    said bottom thin film layer includes carbon doped silicon chromium 2 to 20 nanometers thick;
    said middle thin film layer includes titanium nitride 20 to 200 nanometers thick; and
    said top thin film layer includes carbon doped silicon chromium 10 to 100 nanometers thick.

13. The method of claim 11, in which said step of removing said top thin film layer and said middle thin film layer is performed using an etch mask which overlaps ends of said areas for said first heads, so that said top thin film layer overlaps said middle thin film layer and said bottom thin film layer at said ends of said first heads.

14. The method of claim 13, further including the steps of:
    forming a sidewall dielectric layer conformally over said middle thin film layer and said bottom thin film layer after said step of removing said middle thin film layer and said bottom thin film layer in an area for a third body of a third resistor and leaving said middle thin film layer and said bottom thin film layer in an area for a first body and areas for first heads of a first resistor, and in an area for a second body and areas for second heads of a second resistor; and
    removing said sidewall dielectric layer from horizontal surfaces of said middle thin film layer and said dielectric layer to leave dielectric sidewalls on lateral surfaces of said middle thin film layer and said bottom thin film layer, before said step of forming said top thin film layer.

15. The method of claim 14, in which said step of removing said top thin film layer and said middle thin film layer leaves a filament of said top thin film layer abutting said dielectric sidewall, said filament being laterally separated from said bottom thin film layer in said first body by said dielectric sidewall.

16. The method of claim 11, in which said step of removing said top thin film layer and said middle thin film layer includes a wet etch of said middle thin film layer so that lateral surfaces of said middle thin film layer are recessed from corresponding edges of said top thin film layer in said first heads.

17. The method of claim 11, in which said step of removing said top thin film layer and said middle thin film layer is performed using an etch mask which overlaps said middle thin film layer and said bottom thin film layer around said second heads and said second body, so that said top thin film layer said middle thin film layer and said bottom thin film layer around said second heads and said second body.

18. The method of claim 11, in which said step of removing said top thin film layer and said middle thin film layer is performed using an etch mask which is recessed from edges of said middle thin film layer and said bottom thin film layer around said second heads and said second body, so that lateral surfaces of said middle thin film layer are recessed from corresponding edges of said top thin film layer in said second heads and said second body.

19. The method of claim 11, in which said step of removing said middle thin film layer and said bottom thin film layer is performed so that lateral surfaces of said middle thin film layer are slanted inward.

20. The method of claim 11, in which said step of removing said middle thin film layer and said bottom thin film layer leaves said middle thin film layer and said bottom thin film layer in said areas for said third heads.

21. The method of claim 11, in which said step of removing said middle thin film layer and said bottom thin film layer leaves said third body free of said bottom thin film layer, and said third heads free of said bottom thin film layer and said middle thin film layer.

22. An integrated circuit, comprising:
a dielectric layer;
a first thin film resistor layer over the dielectric layer, the first thin film resistor layer having a sheet resistance between 200 ohms and 20,000 ohms per square;
a second thin film resistor layer over the first thin film resistor layer, the second thin film resistor layer having a sheet resistance between 20 milliohms per square to 20 ohms per square; and
a third thin film resistor layer over the second thin film resistor layer, the third thin film resistor layer having a sheet resistance between 20 ohms to 2000 ohms per square;
a first resistor including a first body and first heads, said first body including the first thin film resistor layer and being free of the second thin film resistor layer and the third thin film resistor layer, said first heads including said first thin film resistor layer, said second thin film resistor layer, and said third thin film resistor layer;
a second resistor including a second body and second heads, said second body and said second heads including said first thin film resistor layer, said second thin film resistor layer and said third thin film resistor layer;
a third resistor including a third body and third heads, said third body and said third heads including said third thin film resistor layer and being free of said second thin film resistor layer and said first thin film resistor layer; and
interconnect vias connected to the first heads, the second heads, and the third heads.

23. An integrated circuit, comprising:
a dielectric layer;
a first thin film resistor layer over the dielectric layer;
a second thin film resistor layer over the first thin film resistor layer; and
a third thin film resistor layer over the second thin film resistor layer;
a first resistor including a first body and first heads, said first body including the first thin film resistor layer and being free of the second thin film resistor layer and the third thin film resistor layer, said first heads including said first thin film resistor layer, said second thin film resistor layer, and said third thin film resistor layer;
a second resistor including a second body and second heads, said second body and said second heads including said first thin film resistor layer, said second thin film resistor layer and said third thin film resistor layer; and
a third resistor including a third body and third heads, said third body and said third heads including said third thin film resistor layer and being free of the second thin film resistor layer and said first thin film resistor layer.

* * * * *